United States Patent
Takahashi et al.

(10) Patent No.: US 8,927,331 B2
(45) Date of Patent: Jan. 6, 2015

(54) METHOD OF MANUFACTURING NONVOLATILE MEMORY DEVICE

(75) Inventors: Ichirou Takahashi, Kyoto (JP); Takumi Mikawa, Shiga (JP)

(73) Assignee: Panasonic Corporation, Osaka (JP)

( * ) Notice: Subject to any disclaimer, the term of this patent is extended or adjusted under 35 U.S.C. 154(b) by 39 days.

(21) Appl. No.: 13/997,818

(22) PCT Filed: Mar. 9, 2012

(86) PCT No.: PCT/JP2012/001620
§ 371 (c)(1),
(2), (4) Date: Jun. 25, 2013

(87) PCT Pub. No.: WO2012/120893
PCT Pub. Date: Sep. 13, 2012

(65) Prior Publication Data
US 2013/0295745 A1 Nov. 7, 2013

(30) Foreign Application Priority Data
Mar. 10, 2011 (JP) ................................. 2011-053209

(51) Int. Cl.
*H01L 21/00* (2006.01)
*H01L 45/00* (2006.01)

(52) U.S. Cl.
CPC ............ *H01L 45/1641* (2013.01); *H01L 45/04* (2013.01); *H01L 45/08* (2013.01); *H01L 45/1233* (2013.01); *H01L 45/146* (2013.01); *H01L 45/1675* (2013.01); *H01L 45/1625* (2013.01)
USPC .................... 438/104; 438/382; 257/E21.662

(58) Field of Classification Search
USPC ................................................. 257/E21.317
See application file for complete search history.

(56) References Cited

U.S. PATENT DOCUMENTS

| | | |
|---|---|---|
| 7,668,002 B2 | 2/2010 | Kinoshita et al. |
| 8,022,502 B2 | 9/2011 | Kanzawa et al. |
| 8,279,658 B2 | 10/2012 | Muraoka et al. |
| 8,395,930 B2 | 3/2013 | Muraoka et al. |
| 2008/0117664 A1 | 5/2008 | Kinoshita et al. |
| 2009/0283736 A1 | 11/2009 | Kanzawa et al. |
| 2011/0080770 A1 | 4/2011 | Muraoka et al. |
| 2011/0294259 A1 | 12/2011 | Kanzawa et al. |
| 2012/0161095 A1 | 6/2012 | Mikawa et al. |
| 2012/0320661 A1 | 12/2012 | Muraoka et al. |

FOREIGN PATENT DOCUMENTS

| | | |
|---|---|---|
| JP | 2009-021524 | 1/2009 |
| JP | 4253038 | 4/2009 |

(Continued)

OTHER PUBLICATIONS

International Search Report issued Apr. 10, 2012 in corresponding International Application No. PCT/JP2012/001620.

(Continued)

*Primary Examiner* — Cheung Lee
(74) *Attorney, Agent, or Firm* — Wenderoth, Lind & Ponack, L.L.P.

(57) ABSTRACT

A method of manufacturing a nonvolatile memory device includes: forming a tantalum oxide material layer including an oxygen-deficient transition metal oxide; forming a tantalum oxide material layer including a transition metal oxide and having a degree of oxygen deficiency lower than a degree of oxygen deficiency of the tantalum oxide material layer; and exposing, after the forming of a tantalum oxide material layer, the tantalum oxide material layer to plasma generated from a noble gas.

23 Claims, 19 Drawing Sheets

(56) References Cited

FOREIGN PATENT DOCUMENTS

| | | |
|---|---|---|
| JP | 2010-226058 | 10/2010 |
| JP | 2010-251352 | 11/2010 |
| WO | 2007/013174 | 2/2007 |
| WO | 2008/149484 | 12/2008 |
| WO | 2010/109876 | 9/2010 |
| WO | 2011/024455 | 3/2011 |

OTHER PUBLICATIONS

Reply to Written Opinion issued Apr. 10, 2012 in corresponding International Application No. PCT/JP2012/001620 (with English translation).

I. G. Baek et al., "Highly Scalable Non-volatile Resistive Memory using Simple Binary Oxide Driven by Asymmetric Unipolar Voltage Pulses", 2004 IEEE International Electron Devices Meeting, IEDM Technical Digest, Dec. 13-15, 2004, pg. 587.

METHOD OF MANUFACTURING NONVOLATILE MEMORY DEVICE

TECHNICAL FIELD

The present invention relates to variable resistance nonvolatile memory elements whose resistance value changes based on electric signals given thereto, and relates in particular to methods of manufacturing nonvolatile memory devices which include a bipolar nonvolatile memory element whose resistance value reversibly changes based on electric signals different in polarity.

BACKGROUND ART

Along with the development of digital technology, recent years have seen a further increase in functionality of electronic devices such as mobile information devices and information home appliances. The increase in functionality of these electronic devices is accompanied by rapid progress in the miniaturization and speeding-up of semiconductor elements used therein. Among these, a large-capacity nonvolatile memory represented by a flash memory is rapidly being given wider application. Furthermore, as a next-generation nonvolatile memory of a new type which will replace this flash memory, a nonvolatile memory device which includes, what is called, a variable resistance nonvolatile memory element has been progressively studied and developed. Here, a variable resistance nonvolatile memory element is an element whose resistance value reversibly changes based on electrical signals, and is capable of storing data corresponding to this resistance value in a nonvolatile manner.

As disclosed by Patent Literature (PTL) 1, a variable resistance nonvolatile memory element has a structure in which a variable resistance layer made of a variable resistance material is located between paired electrodes, and is roughly classified into two types, a bipolar type and a unipolar type, based on a difference in electrical properties.

The bipolar nonvolatile memory element (hereinafter referred to as a bipolar element) is an element of a type that requires voltages different in polarity for changing its resistance state from a high resistance state to a low resistance state (low resistance writing) and for changing its resistance state from a low resistance state to a high resistance state (high resistance writing). In contrast, the unipolar nonvolatile memory element (hereinafter referred to as a unipolar element) is an element of a type that requires voltages the same in polarity for low resistance writing and for high resistance writing.

As disclosed by PTL 2, stable high-speed drive at low voltage can be realized using a bipolar element which includes a variable resistance layer having a structure in which a high resistance layer (a high-oxygen-concentration layer) and a low resistance layer (a low-oxygen-concentration layer) are stacked. PTL 2 discloses a variable resistance element in which tantalum oxide layers having different oxygen content atomic percentages are stacked as a variable resistance layer.

CITATION LIST

Patent Literature

[PTL 1] International Publication No. WO2007/013174
[PTL 2] International Publication No. WO2008/149484

Non Patent Literature

[NPL 1]
[NPL 1] I. G. Baek et al., Tech. Digest IEDM 2004, page 587

SUMMARY OF INVENTION

Technical Problem

PTL 2 discloses a variable resistance element in which tantalum oxide layers having different oxygen content atomic percentages are stacked as a variable resistance layer.

FIG. 15 schematically shows an example of a cross-sectional structure of a nonvolatile memory device in which the variable resistance element disclosed by PTL 2 is mounted. A nonvolatile memory device 600 shown in FIG. 15 includes: a substrate 500; a first line 501 formed on the substrate 500; a first interlayer dielectric layer 502 formed on the substrate 500 so as to coat the first line 501; a first contact plug 504 formed by filling the inside of a first contact hole 503 with tungsten as a primary component; a variable resistance element 512 formed on the first interlayer dielectric layer 502 so as to cover the first contact plug 504; a second interlayer dielectric layer 508 formed so as to cover the variable resistance element 512; a second contact plug 510 formed inside a second contact hole 509; and a second line 511 formed on the second interlayer dielectric layer 508 so as to cover the second contact plug 510.

The first contact plug 504 penetrates the first interlayer dielectric layer 502 to electrically connect the first line 501 and a first electrode layer 505. The second contact plug 510 penetrates the second interlayer dielectric layer 508 to electrically connect a second electrode layer 507 and the second line 511.

The variable resistance element 512 includes the first electrode layer 505, a variable resistance layer 506, and the second electrode layer 507. Furthermore, the variable resistance layer 506 has a structure in which a first tantalum oxide layer 506a and a second tantalum oxide layer 506b are stacked. The second tantalum oxide layer 506b has a composition represented as $TaO_y$ which satisfies $2.1 \leq y \leq 2.5$, and the first tantalum oxide layer 506a has a composition represented as $TaO_x$ which satisfies $0.8 \leq x \leq 1.9$.

Such a conventional nonvolatile memory device has a problem in ensuring reliability including endurance (rewrite tolerability) in particular.

The present invention aims to solve the above-stated problem and provide a method of manufacturing a nonvolatile memory device having high endurance characteristics.

Solution to Problem

In order to achieve the above-described goal, the method of manufacturing a nonvolatile memory device according to an aspect of the present invention comprises: forming a first oxide material layer comprising an oxygen-deficient transition metal oxide; forming a second oxide material layer comprising a transition metal oxide and having a degree of oxygen deficiency lower than a degree of oxygen deficiency of the first oxide material layer; and exposing the second oxide material layer to plasma after the forming of a second oxide material layer, the plasma being generated from a noble gas.

Advantageous Effects of Invention

In the method of manufacturing a nonvolatile memory device according to the present invention, the forming of a second oxide layer is followed by exposing a surface of the second oxide layer to plasma containing a noble gas, which makes it possible to provide a nonvolatile memory device having high endurance characteristics.

DESCRIPTION OF EMBODIMENTS (Underlying Knowledge Forming Basis of the Present Invention)

The inventors of the present invention have dedicated to studies with an aim to improve reliability of a nonvolatile memory device and consequently found that a heat budget given to a variable resistance element causes oxygen in a second tantalum oxide layer to diffuse and leads to a degradation of reliability characteristics such as endurance, in light of which the inventors completed the present invention. The following describes such problems first and then describes Embodiments of the present invention.

In the case disclosed by PTL 2 where the nonvolatile memory device 600 is formed using the variable resistance element 512, the following problem occurs. In the process of manufacturing the nonvolatile memory device 600, thermal treatment is performed on the variable resistance element 512 in steps of forming an interlayer dielectric layer, forming a plug, forming a line, recovery annealing, and so on at the time of forming multilayer lines. Through this thermal treatment or the like, a heat budget is given to the variable resistance element 512, and oxygen diffuses from the second tantalum oxide layer 506b to the first tantalum oxide layer 506a.

Figure 16:
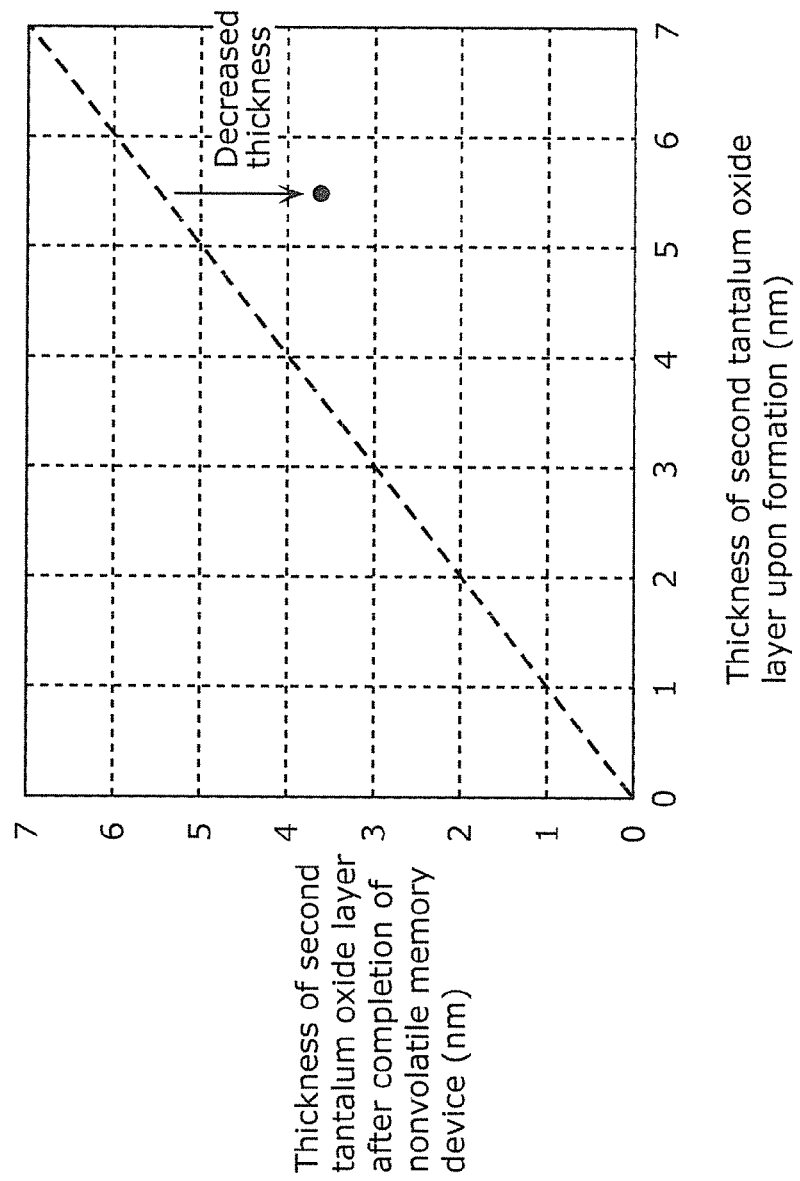
FIG. 16 is a graph showing a relationship between a thickness of a second tantalum oxide layer upon formation thereof in a variable resistance element and a thickness of the second tantalum oxide layer after completion of a nonvolatile memory device.

FIG. 16 is a graph showing a relationship between a thickness of the second tantalum oxide layer in the variable resistance element upon formation of the second tantalum oxide layer (hereinafter referred to as "formation thickness") and a thickness of the second tantalum oxide after completion of the nonvolatile memory device (hereinafter referred to as "post-completion thickness"). FIG. 16 shows a relationship between the formation thickness of the second tantalum oxide layer (in the horizontal axis of the graph) and the post-completion thickness of the second tantalum oxide layer (in the vertical axis of the graph) in the variable resistance element which includes a variable resistance layer having the above-mentioned first tantalum oxide material layer represented as $TaO_x$ and the above-mentioned second tantalum oxide material layer represented as $TaO_y$. In FIG. 16, the broken line indicates where the second tantalum oxide layer has a formation thickness and a completion thickness which are equal to each other. The graph of FIG. 16 shows that the post-completion thickness of the second tantalum oxide layer is smaller than the formation thickness thereof. This means that the thickness of the second tantalum oxide layer decreases during a period from the formation of the variable resistance element until the completion of the nonvolatile memory device (see "decreased thickness").

Figure 17:
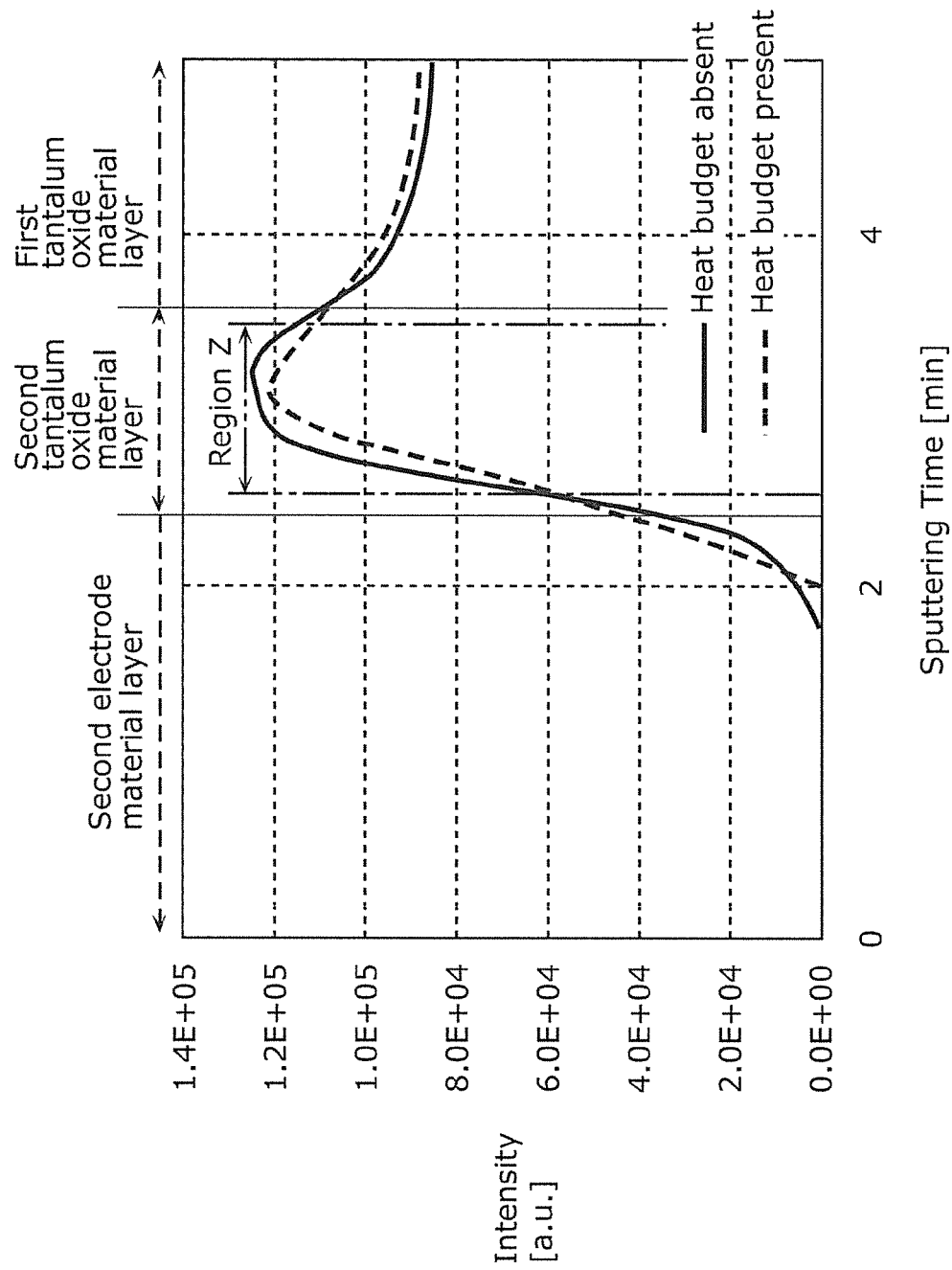
FIG. 17 is a graph showing a result of analysis on an oxygen-concentration profile of a multilayer film having a structure of a variable resistance element disclosed by PTL 2.

FIG. 17 is a graph showing a result of analysis on an oxygen-concentration profile of a multilayer film having the same structure as the structure of the variable resistance element disclosed by PTL 2. Specifically, the graph shown in FIG. 17 shows a result of thickness-wise Auger electron spectroscopy (AES) analysis on an oxygen-concentration profile of a layer in which the above-mentioned first tantalum oxide material layer represented as $TaO_x$, the above-mentioned second tantalum oxide material layer represented as TaO$_y$, and a second electrode material layer comprising iridium are stacked in this order. Furthermore, FIG. 17 shows, in parallel, an oxygen-concentration profile of a sample given a heat budget (a broken line) and an oxygen-concentration profile of a sample given no heat budget (a solid line) after formation of the second electrode material layer using iridium. Here, the heat budget collectively refers to heating steps for the variable resistance layer in standard processes of forming an interlayer dielectric layer, a line, a protective layer, and so on after formation of the variable resistance element. In an example shown in FIG. 17 where a heat budget is present, the heat budget is assumed to be defined by 400 degrees Celsius for 30 minutes.

As can be seen from FIG. 17, giving the heat budget leads to attenuation of the peak intensity of oxygen in the second tantalum oxide material layer (in a region Z of FIG. 17) and increases the peak intensity of oxygen in the first tantalum oxide material layer. This means that giving the heat budget causes the oxygen inside the second tantalum oxide material layer to diffuse to the first tantalum oxide material layer.

A resistance value, resistance change characteristics, etc., of the variable resistance element 512 depend on a thickness and oxygen content of the second tantalum oxide material layer. Accordingly, as shown in FIG. 17, when the oxygen diffuses from the second tantalum oxide material layer due to the heat budget given thereto, causing the oxygen content and thickness of the second tantalum oxide material layer to decrease, then the resistance value, the resistance change characteristics, etc., will change. For this reason, the degradation of the oxygen-concentration profile due to the heat budget needs to be inhibited in order to obtain a nonvolatile memory device having desired resistance value and resistance change characteristics. The degradation of the oxygen-concentration profile due to the heat budget causes the properties and thickness of the second tantalum oxide layer to vary in the plane of a wafer, which will eventually degrade the reliability characteristics such as endurance. Thus, in order to improve the reliability of a nonvolatile memory device, it is required that the thickness of the second tantalum oxide layer do not decrease after formation of the nonvolatile memory device, that is, a technique is indispensable which enables the nonvolatile memory device to be manufactured without oxygen to diffuse from the second tantalum oxide layer even when the heat budget is given.

In view of the above situation, the inventors conducted experiments in which thermal treatment was performed using a rapid thermal process (RTP) after formation of the second tantalum oxide material layer, for the purpose of improving the quality of the second tantalum oxide material layer so as to make it hard for oxygen therein to diffuse. After forming the variable resistance element, they performed a rapid thermal annealing (RTA) process to form an iridium electrode on the top. Steps subsequent to this process are not described. No heat budget was added in the subsequent steps.

Figure 18:
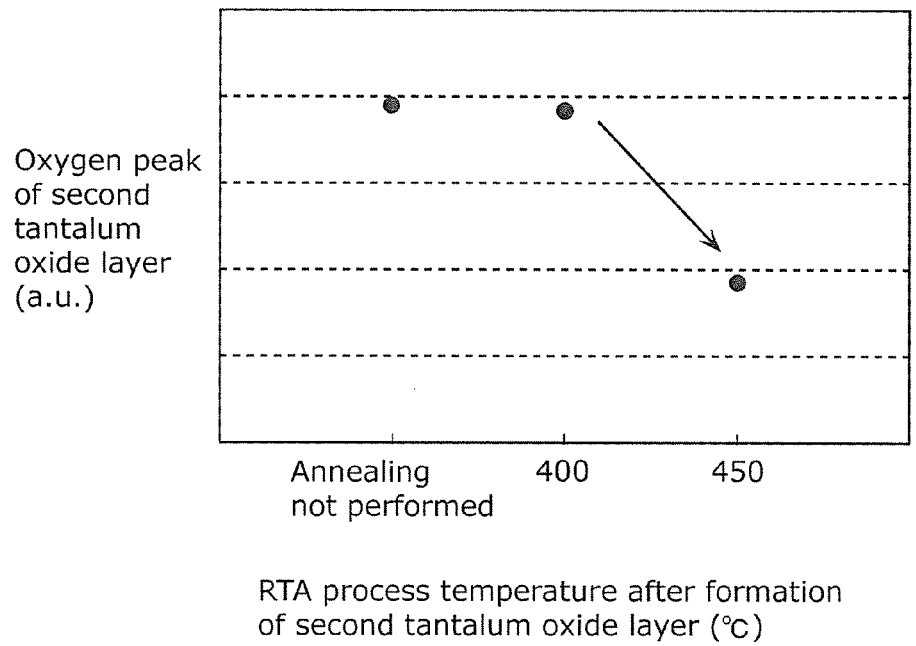
FIG. 18 is a graph showing a relationship between an AES-analyzed oxygen peak of the second tantalum oxide layer and an RTA process temperature at the time immediately after formation of the variable resistance element.

FIG. 18 is a graph showing a relationship between an AES-analyzed oxygen peak of the second tantalum oxide layer and an RTA process temperature at the time immediately after formation of the variable resistance element. As shown in FIG. 18, when the RTA temperature is set to a high temperature of 450 degrees Celsius, the AES-analyzed oxygen peak of the second tantalum oxide layer is significantly lowered, which means that oxygen has already diffused at the time of RTA after formation of a high resistance layer, i.e., the second tantalum oxide layer. Although details are described later, it is known that RTA at 400 degrees Celsius has an inhibitory effect on oxygen diffusion because of the Ta—O bond being strengthened, but a result of the RTA at 450 degrees Celsius shows that the oxygen diffusion progresses at the same time. Thus, the inventors of the present invention supposed that there was a limit to the method in which heat energy is applied to the high resistance layer, i.e., the second tantalum oxide layer, for the purpose of improving the quality of the second tantalum oxide layer so that the occurrence of oxygen diffusion therein is reduced, and giving energy to the high resistance layer, i.e., the second tantalum oxide layer, without application of heat is effective.

In addition, the problem of oxygen diffusion presumably occurs not only in a variable resistance layer including the tantalum oxide but also in a variable resistance layer including an oxide layer comprising an oxygen-deficient transition metal oxide.

In order to solve such a problem, the method of manufacturing a nonvolatile memory device according to an aspect of the present invention comprises: forming a first oxide material layer comprising an oxygen-deficient transition metal oxide; forming a second oxide material layer comprising a transition metal oxide and having a degree of oxygen deficiency lower than a degree of oxygen deficiency of the first oxide material layer; and exposing the second oxide material layer to plasma after the forming of a second oxide material layer, the plasma being generated from a noble gas.

Because of this aspect, it is possible to reduce the occurrence of oxygen diffusion from the second oxide material layer to the first oxide material layer, for example, in a process which is performed after formation of the second oxide material layer and accompanies thermal treatment. Accordingly, the decrease of an effective thickness of the second oxide material layer can be reduced, which can improve the device performance of the variable resistance element. Furthermore, the reduced variations in device performance can lead to a reduction in the variations of voltage which is applied to the variable resistance layer, with the result that high endurance characteristics can be provided.

Furthermore, it may be, for example, that in the exposing, the second oxide material layer is exposed to plasma generated from a noble gas only.

Furthermore, it may be, for example, that in the exposing, the noble gas is a single kind of noble gas.

Furthermore, it may be, for example, that the method of manufacturing a nonvolatile memory device further comprises: forming a first electrode material layer above a substrate; and forming a second electrode material layer on the second oxide material layer, wherein in the forming of a first oxide material layer, the first oxide material layer is formed on the first electrode material layer, and in the forming of a second oxide material layer, the second oxide material layer is formed on the first oxide material layer.

Furthermore, it may be, for example, that the method of manufacturing a nonvolatile memory device further comprises: forming a first electrode material layer above a substrate; and forming a second electrode material layer on the first oxide material layer, wherein in the forming of a second oxide material layer, the second oxide material layer is formed on the first electrode material layer, and in the forming of a first oxide material layer, the first oxide material layer is formed on the second oxide material layer.

Furthermore, the method of manufacturing a nonvolatile memory device according to an aspect comprises: forming a first electrode material layer above a substrate; depositing, on the first electrode material layer, a first oxide material layer comprising an oxygen-deficient transition metal oxide; depositing, on the first oxide material layer, a second oxide material layer comprising a transition metal oxide and having a degree of oxygen deficiency lower than a degree of oxygen deficiency of the first oxide material layer; exposing the second oxide material layer to plasma after the depositing of a second oxide material layer, the plasma being generated from gas containing at least a noble gas; forming a second electrode material layer on the second oxide material layer after the exposing; and applying an initialization voltage pulse between a first electrode layer and a second electrode layer to form a conductive path in a variable resistance element including the first electrode layer, a first variable resistance layer, a second variable resistance layer, and the second electrode layer which are formed through patterning of the first electrode material layer, the first oxide material layer, the second oxide material layer, and the second electrode material layer, respectively, the conductive path extending from one surface to another of the second variable resistance layer, the one surface being in contact with the second electrode layer, and the other surface being in contact with the first variable resistance layer.

Furthermore, the method of manufacturing a nonvolatile memory device according to an aspect comprises: forming a first electrode material layer above a substrate; depositing, on the first electrode material layer, a second oxide material layer comprising a transition metal oxide; depositing, on the second oxide material layer, a first oxide material layer comprising an oxygen-deficient transition metal oxide and having a degree of oxygen deficiency higher than a degree of oxygen deficiency of the second oxide material layer; exposing the second oxide material layer to plasma before the depositing of a first oxide material layer after the depositing of a second oxide material layer, the plasma being generated from gas containing at least a noble gas; forming a second electrode material layer on the first oxide material layer after the depositing of a first oxide material layer; and applying an initialization voltage pulse between a first electrode layer and a second electrode layer to form a conductive path in a variable resistance element including the first electrode layer, a second variable resistance layer, a first variable resistance layer, and the second electrode layer which are formed through patterning of the first electrode material layer, the second oxide material layer, the first oxide material layer, and the second electrode material layer, respectively, the conductive path extending from one surface to another of the second variable resistance layer, the one surface being in contact with the first electrode layer, and the other surface being in contact with the first variable resistance layer.

In these manufacturing methods, it is possible to reduce the occurrence of oxygen diffusion from the second oxide material layer to the first oxide material layer, for example, in a process which is performed after formation of the second oxide material layer and accompanies thermal treatment. Accordingly, the decrease of an effective thickness of the second oxide material layer can be reduced, which can improve the device performance of the variable resistance element. Furthermore, reduced variations in device performance can lead to a reduction in the variations of voltage which is applied to the variable resistance layer, with the result that high endurance characteristics can be provided. Moreover, the second tantalum oxide material layer formed as a deposited film has a thickness with less variations than a thickness of a film formed by oxidation, which makes it possible to form a filament at lower forming voltage and thus facilitates the forming process. In addition, a filament current that flows through the formed filament is stabilized.

Furthermore, it may be, for example, that the exposing includes mixture plasma treatment of exposing the second oxide material layer to plasma generated from a gas mixture of a noble gas and oxygen.

By doing so, it is possible to more efficiently reduce the oxygen diffusion and more efficiently reduce the decrease of an effective thickness of the second oxide material layer.

Furthermore, it may be, for example, that the exposing further includes, before the mixture plasma treatment, single-gas plasma treatment of exposing the second oxide material layer to plasma generated from a single kind of noble gas.

Furthermore, it may be, for example, that the exposing further includes, after the mixture plasma treatment, annealing which is thermal treatment in a nitrogen gas atmosphere.

Furthermore, it may be, for example, that the forming of a second oxide material layer and the exposing are continuously repeated more then once.

In this manufacturing method, the step of forming a second oxide material layer and the step of exposing a surface of the second oxide material layer to plasma are repeated more than once, which enables more effective restoration of an oxygen defect site. By doing so, it is possible to effectively reduce the decrease of an effective thickness of the second oxide material layer.

Furthermore, it may be, for example, that the first oxide material layer comprises tantalum oxide having a composition represented as $TaO_x$ (where $0.8 \leq x \leq 1.9$), and the second oxide material layer comprises tantalum oxide having a composition represented as $TaO_y$ (where $x<y$).

By doing so, it is possible to make the resistance value of the variable resistance layer stably change.

It is to be noted that these general and specific aspects may be implemented using a system, a method, an integrated circuit, a computer program, or a recording medium, or any combination of systems, methods, integrated circuits, computer programs, or recording media.

The method of manufacturing a nonvolatile memory device according to an aspect of the present invention shall be specifically described below with reference to the drawings.

It is to be noted that the embodiments described below each shows one specific preferred example of the present invention. The numerical values, shapes, materials, structural elements, the arrangement and connection of the structural elements, steps, the processing order of the steps etc., shown in the following embodiments are mere examples and therefore do not limit the present invention. Furthermore, among the structural elements in the following embodiments, structural elements not recited in any one of the independent claims which defines the broadest concept of the present invention are described as arbitrary structural elements which are included in a more preferable embodiment.

The same structural elements are denoted by the same reference signs, and there is a case where descriptions on such structural elements are omitted. The shapes of transistors, variable resistance elements, and so on are schematic, and the number thereof is set to a number which facilitates illustration. Embodiments 1 to 3 are described with a structure (B-mode structure) in which the first tantalum oxide layer having a low oxygen content atomic percentage is formed on the first electrode and the second tantalum oxide layer having a high oxygen content atomic percentage is formed on the first tantalum oxide layer.

(Embodiment 1)
[Structure of Nonvolatile Memory Device]

Figure 1:
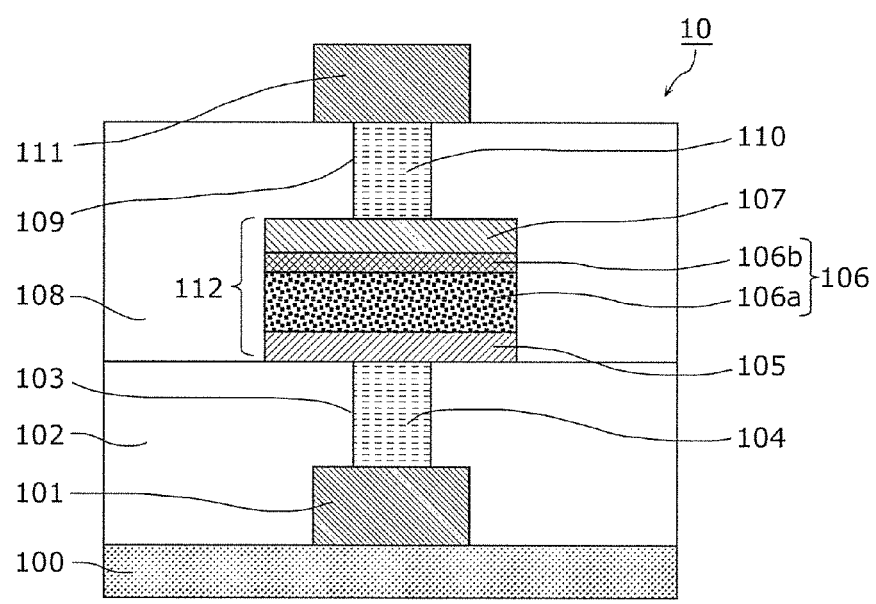
FIG. 1 is a cross-sectional view showing a schematic structure of a nonvolatile memory device according to Embodiment 1 of the present invention.

FIG. 1 is a cross-sectional view showing a schematic structure of a nonvolatile memory device according to Embodiment 1 of the present invention. A nonvolatile memory device 10 shown in FIG. 1 is a nonvolatile memory device including a variable resistance element 112 and includes: a substrate 100; a first line 101 formed on the substrate 100; a first interlayer dielectric layer 102 formed on the substrate 100 so as to coat the first line 101; a first contact plug 104 formed by filling the inside of a first contact hole 103 (with a diameter of 50 to 300 nm) with tungsten as a primary component; a variable resistance element 112 formed on the first interlayer dielectric layer 102 so as to connect to the first contact plug 104; a second interlayer dielectric layer 108 formed so as to cover the variable resistance element 112; a second contact plug 110 formed by filling the inside of a second contact hole 109 (with a diameter of 50 to 300 nm) with tungsten as a primary component; and a second line 111 formed on the second interlayer dielectric layer 108 so as to connect to the second contact plug 110.

The first interlayer dielectric layer 102 includes a silicon oxide film (with a thickness of 500 to 1000 nm), for example. The second interlayer dielectric layer 108 includes a silicon oxide film (with a thickness of 500 to 1000 nm). The first contact plug 104 penetrates the first interlayer dielectric layer 102 to electrically connect the first line 101 and a first electrode layer 105. The second contact plug 110 penetrates the second interlayer dielectric layer 108 to electrically connect a second electrode layer 107 and the second line 111.

The variable resistance element 112 includes the first electrode layer 105 comprising tantalum nitride or the like (with a thickness of 5 to 100 nm), a variable resistance layer 106 (with a thickness of 20 to 100 nm), and the second electrode layer 107 comprising a noble metal (Pt, Ir, Pd, etc.) (with a thickness of 5 to 100 nm). For the second electrode layer 107, it is preferable to use a noble metal in terms of resistance change characteristics. Meanwhile, although a noble metal is generally difficult to work with, this embodiment provides relatively high workability since the second electrode layer 107 is located in the upper part of the variable resistance element 112.

Here, the first electrode layer 105 may comprise one or some of the following materials: gold (Au), platinum (Pt), iridium (Ir), copper (Cu), tantalum nitride (TaN), tantalum (Ta), titanium (Ti), and titanium nitride (TiN). Furthermore, the first electrode layer 105 may be equal in size to the second electrode layer 107. As to the arrangement, the electrode layers and the metal oxide layers may each be upside down.

The variable resistance layer 106 includes stacked layers of: a first variable resistance layer 106a that is the first oxide layer comprising an oxygen-deficient transition metal oxide, i.e., tantalum oxide; and a second variable resistance layer 106b that is the second variable resistance layer comprising tantalum oxide. Here, an oxygen content atomic percentage of the second variable resistance layer 106b is higher than an oxygen content atomic percentage of the first variable resistance layer 106a. Here, the oxygen-deficient transition metal oxide indicates an oxide which has an oxygen content (atom ratio: the proportion of the number of oxygen atoms to the total number of atoms) less than an oxygen content of an oxide having a stoichiometric composition. For example, in the case where the transition metal element is tantalum (Ta), the stoichiometric composition of the oxide is $Ta_2O_5$, and the proportion of the number of O atoms to the number of Ta atoms (O/Ta) is 2.5. Thus, the atom ratio between Ta and O in the oxygen-deficient Ta oxide is greater than 0 and less than 2.5.

It is preferred that x be at least 0.8 and at most 1.9 where the tantalum oxide in the first variable resistance layer 106a has a composition $TaO_x$ and y be at least 2.1 and at most 2.5 where the tantalum oxide in the second variable resistance layer 106b has a composition $TaO_y$. With this, it is possible to make the resistance value of the variable resistance layer 106 stably change at high speed. The second variable resistance layer 106b is exposed to Ar plasma as described later, after tantalum oxide that is a constituent material of the second variable resistance layer 106b is deposited by sputtering. By doing so, the occurrence of oxygen diffusion from the tantalum oxide of the second variable resistance layer 106b due to a heat budget generated in the subsequent steps such as an element-forming step can be reduced.

Next, a resistance changing operation by the nonvolatile memory device 10 is described. The variable resistance element 112 in the nonvolatile memory device 10 changes from a high resistance state to a low resistance state (low resistance writing) as a result of a negative voltage pulse being applied to the second electrode layer 107 with reference to the first electrode layer 105, and conversely, changes from a low resistance state to a high resistance state (high resistance writing) as a result of a positive voltage pulse being applied to the second electrode layer 107 with reference to the first electrode layer 105.

It is presumed that the negative voltage pulse applied to the second electrode layer 107 causes the oxygen ions inside the second variable resistance layer 106b to be forced out, resulting in a decrease in the oxygen content atomic percentage in at least part of the region of the second variable resistance layer 106b. This presumably causes low resistance writing. On the other hand, it is presumed that the positive voltage pulse applied to the second electrode layer 107 causes the oxygen ions inside the first variable resistance layer 106a to be taken into the second variable resistance layer 106b, resulting in an increase in the oxygen content atomic percentage of the second variable resistance layer 106b. This presumably causes high resistance writing.

[Method of Manufacturing Nonvolatile Memory Device]

Figure 2:
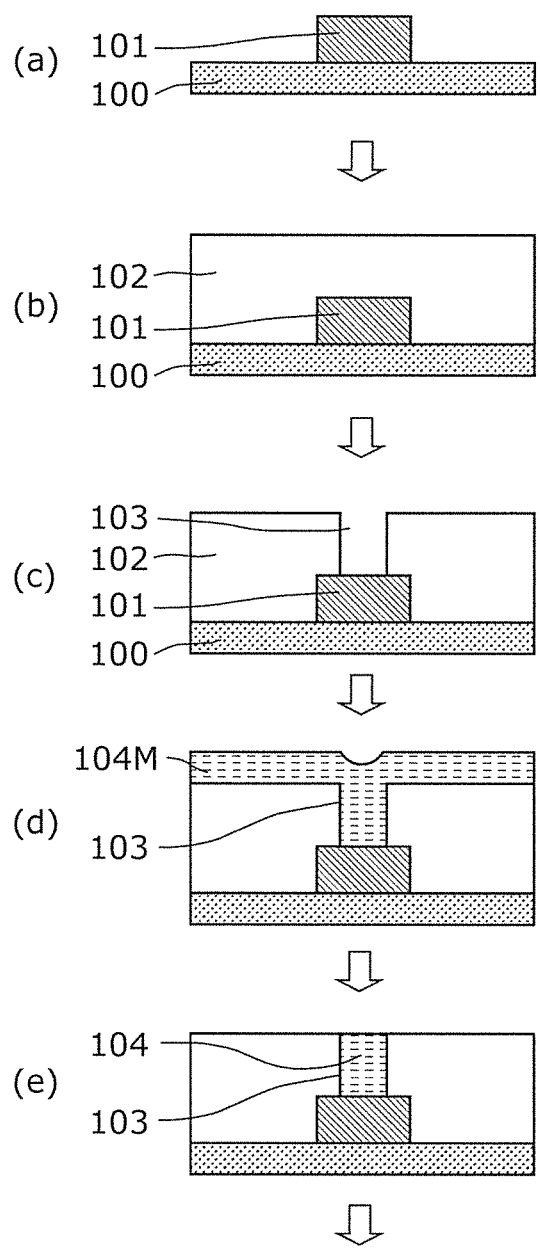
FIG. 2 consists of (a) to (e) which are cross-sectional views showing an example of a first half of the steps of the method of manufacturing a nonvolatile memory device according to Embodiment 1 of the present invention.
Figure 3:
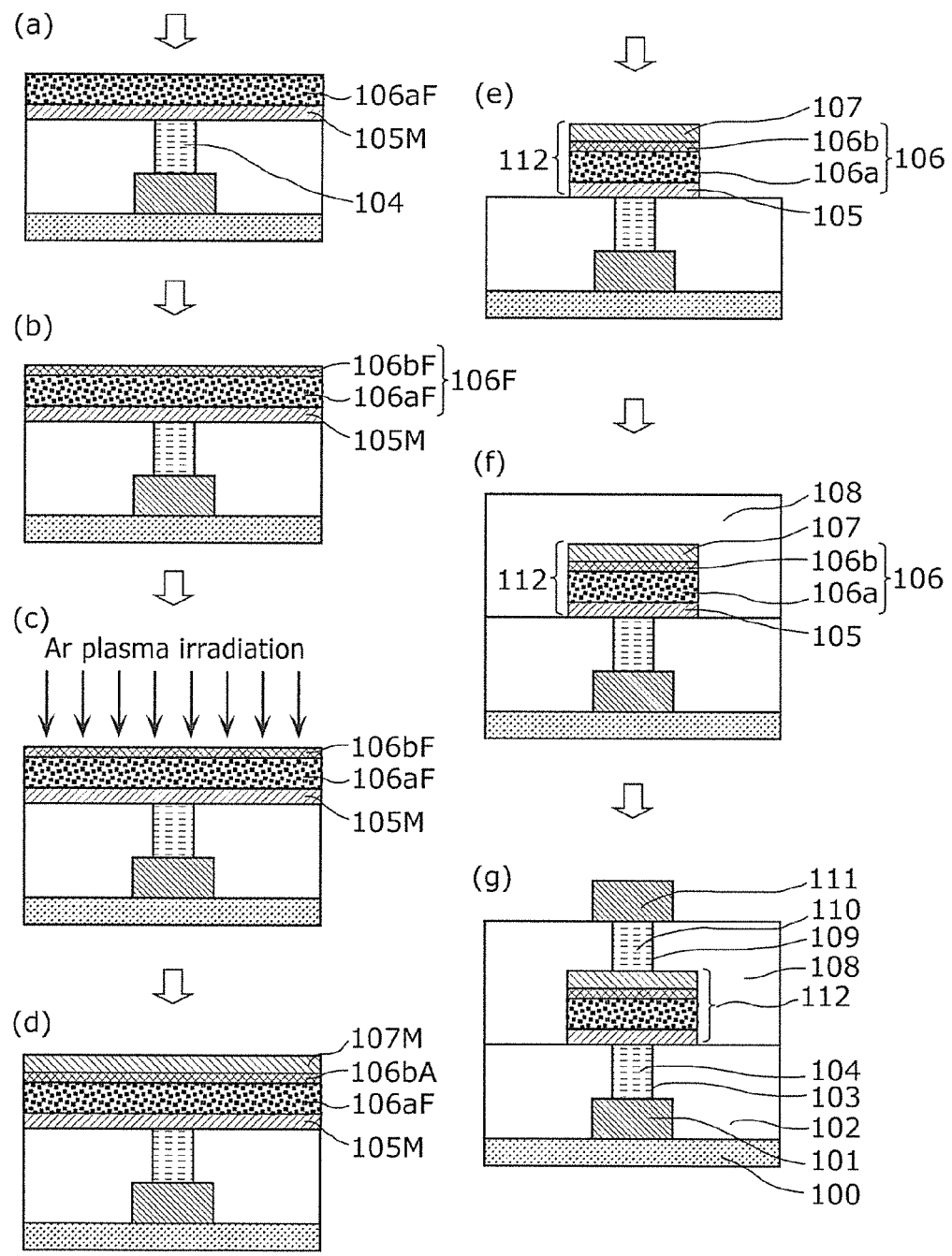
FIG. 3 consists of (a) to (g) which are cross-sectional views showing an example of a second half of steps of the method of manufacturing a nonvolatile memory device according to Embodiment 1 of the present invention.

FIG. 2 and FIG. 3 consist of (a) to (e) and (a) to (g) which are cross-sectional views showing examples of a first half and a second half, respectively, of the steps of the method of manufacturing a nonvolatile memory device according to Embodiment 1 of the present invention. With reference to these figures, the major part of the method of manufacturing the nonvolatile memory device 10 is described. It is to be noted that the following description shows mere examples in which particular materials, processing methods, and process conditions are illustrative and not restrictive. The following manufacturing method is applicable in combination with a known method.

FIG. 2 shows, in (a), a cross-sectional view obtained after a step of forming the first line 101. In this step, first, a conductive layer comprising aluminum (with a thickness of 400 to 600 nm) is formed by sputtering on the substrate 100 that is a semiconductor substrate on which transistors, lower-layer lines, and so on have been formed. Next, the resultant layer is treated with patterning and dry etching in which a desired mask is used, to form the first line 101. Through the foregoing, the first line 101 is formed.

FIG. 2 shows, in (b), a cross-sectional view obtained after a step of forming the second interlayer dielectric layer 102. In this step, first, plasma tetraethyl orthosilicate (TEOS) is formed as a dielectric layer on the substrate 100 by chemical vapor deposition (CVD) so as to cover the first line 101. Subsequently, the surface is planarized to form the first interlayer dielectric layer 102 (with a thickness of 500 to 1000 nm). Through the foregoing, the first interlayer dielectric layer 102 is formed. The first interlayer dielectric layer 102 may be formed using, other than plasma TEOS, a fluorinecontaining oxide (e.g., FSG) or a low-k material in order to reduce inter-line parasitic capacitance.

FIG. 2 shows, in (c), a cross-sectional view obtained after a step of forming the first contact hole 103. In this step, the first contact hole (with a diameter of 50 to 300 nm) that penetrates the first interlayer dielectric layer 102 to connect to the first line 101 is formed by patterning and dry etching in which a desired mask is used. In the profile shown in (c) of FIG. 2, the width of the first line 101 is larger than the width of the first contact hole 103. With this, even when mask misalignment occurs at the time of patterning, the area in which the first line 101 contacts the first contact plug 104 can be maintained constant. As a result, fluctuations in cell current which occur due to varied contact areas, for example, can be prevented.

FIG. 2 shows, in (d), a cross-sectional view obtained after a step of filling the first contact plug 104 with a conductive material. In this step, first, a titanium (Ti)/titanium nitride (TiN) layer functioning as an adhesive layer and a diffusion barrier (each with a thickness of 5 to 30 nm) is formed in the lower layer by sputtering/CVD. Subsequently, tungsten (W with a thickness of 200 to 400 nm) that becomes a main structural element of the contact plug is formed in the upper layer by CVD. As a result, the first contact hole 103 is filled with a conductive layer 104M having a stacked-layer structure (W/Ti/TiN structure) that eventually becomes the first contact plug 104.

FIG. 2 shows, in (e), a cross-sectional view obtained after a step of forming the first contact plug 104. In this step, the entire surfaces of the wafer are polished and planarized by chemical mechanical polishing (CMP) to remove the unnecessary conductive layer 104M on the first interlayer dielectric layer 102. By doing so, the first contact plug 104 is formed inside the first contact hole 103.

FIG. 3 shows, in (a), a cross-sectional view obtained after a step of forming a first electrode material layer 105M and a tantalum oxide material layer 106aF. In this step, first, the first electrode material layer 105M (with a thickness of 20 to 50 nm) comprising tantalum oxide (TaN) is formed on the first interlayer dielectric layer 102 by sputtering so as to cover the first contact plug 104. It is to be noted that the first electrode material layer 105M is a thin film which is supposed to go through patterning in a subsequent step and eventually becomes the first electrode layer 105, and thus is included in the first electrode layer 105. Subsequently, on the first electrode material layer 105M, the tantalum oxide material layer 106aF that is the first oxide material layer is formed by sputtering. To form the tantalum oxide material layer 106aF, what is called reactive sputtering is used in which a sputtering target comprising tantalum is sputtered in the atmosphere containing oxygen. The thickness of the tantalum oxide material layer 106aF can be measured using the spectroscopic ellipsometry and is assumed to be 30 nm, for example. The condition for sputtering is 1000 W for power output, 0.05 Pa for a layer formation pressure, argon-oxygen mixture gas for a sputtering gas, and such a controlled oxygen flow rate that the resistivity of the tantalum oxide material layer 106aF becomes 3 mΩcm, for example. The tantalum oxide material layer 106aF is a thin film which is supposed to go through patterning and eventually becomes the first variable resistance layer 106a, and thus is included in the first variable resistance layer 106a. Through the foregoing, the first electrode material layer 105M and the tantalum oxide material layer 106aF are formed.

FIG. 3 shows, in (b), a cross-sectional view obtained after a first layer-forming step of forming a tantalum oxide material layer 106bF having higher resistivity than resistivity of the tantalum oxide material layer 106aF. In this step, the tantalum oxide material layer 106bF that is the second oxide material layer is formed on the tantalum oxide material layer 106aF. To form the tantalum oxide material layer 106bF, radio-frequency (RF) magnetron sputtering is applied in which tantalum oxide having a composition represented as $Ta_2O_5$ is used as a sputtering target, and argon (Ar) is used for a sputtering gas. The condition for sputtering is, for example, 200 W for RF power output, 0.3 Pa for a layer formation pressure, 300 sccm for an argon gas flow rate, and a room temperature for a substrate temperature. The thickness of the tantalum oxide material layer 106bF which is effective in causing a resistance change with reference to the tantalum oxide material layer 106aF is 3 to 10 nm, and this thickness is measured using the spectroscopic ellipsometry. In addition, the rate of forming the tantalum oxide material layer 106bF using the above-stated condition for sputtering is 1.2 nm/min, for example. The tantalum oxide material layer 106bF is a layer which is supposed to go though surface treatment and patterning and eventually becomes the second variable resistance layer 106b.

FIG. 3 shows, in (c), a cross-sectional view obtained in a step of irradiating, with Ar plasma, the tantalum oxide material layer 106bF that eventually becomes the second variable resistance layer 106b. Through the plasma irradiation, the quality of the tantalum oxide material layer 106bF changes. The tantalum oxide material layer after the plasma irradiation is hereinafter referred to as a tantalum oxide material layer 106bA for the sake of convenience of explanation. In this step, a plasma device is used which includes a power supply for generating the plasma and a high frequency (RF) power supply for controlling substrate bias. The condition for this step is, for example, a room temperature for the substrate temperature at the time of plasma irradiation, 500 W for power at the power supply for generating the plasma, 3 Pa for a pressure, Ar=100 sccm for a gas flow rate, and 5 minutes for process time. Although details are described later, the occurrence of diffusion of the oxygen in the second variable resistance layer 106b into the first variable resistance layer 106a is reduced. This Ar plasma irradiation step corresponds to plasma treatment of exposing a surface of the tantalum oxide material layer 106bF to plasma generated from gas containing at least a noble gas, and further corresponds to single-gas plasma treatment of exposing the surface of the tantalum oxide material layer 106bF to plasma generated from a single kind of noble gas. In other words, an example where "the gas containing a noble gas" is Ar gas is explained in this embodiment, but this is for the sake of convenience of explanation and as will be mentioned later, this embodiment is not limited to what is explained herein. In addition, the plasma generated in this step does not contain oxygen or oxygen radicals.

Here, as Example 1-(1) and Example 1-(2), experiments were conducted under two respective conditions where the substrate bias is 0 W and 20 W (see Table 1).

Table 1 shows Examples and process conditions thereof for the nonvolatile memory device according to Embodiment 1.

In addition, as a reference example, a sample was produced by, instead of performing the Ar plasma treatment ((c) in FIG. 3) after forming the tantalum oxide material layer 106bF (after (b) in FIG. 3), performing the RTA process at 400 degrees Celsius for 10 minutes in the nitrogen atmosphere after forming the tantalum oxide material layer 106bF, which example is referred to as Reference Example H-(2) (see Table 1). In addition, a sample was produced without the Ar plasma treatment and the RTA process after the tantalum oxide material layer 106bF was formed, which example is referred to as Comparative Example H-(1) (see Table 1). In the manufacturing methods for the above-stated Examples, Reference Example, and Comparative example, the steps other than the above (the steps other than (c) in FIG. 3) are the same or alike as those shown in FIGS. 2 and 3. Although details are described later, it was observed that, in Reference Example H-(2) where the RTA process was performed, the occurrence of diffusion of the oxygen in the second variable resistance layer 106b into the first variable resistance layer 106a was lower than in Comparative Example H-(1) where no processing was performed on the tantalum oxide material layer 106bF. In Examples where the Ar plasma irradiation was performed, a diffusion inhibitory effect was obtained the degree of which is substantially the same as in Reference Example where the RTA process was performed, which shows that the diffusion inhibitory effect is produced without thermal treatment of the substrate. Details will be described later.

Furthermore, as Example 1-(3), Ar plasma irradiation was performed under the same condition as in Example 1-(1) first, and an RTA process was then performed in the nitrogen atmosphere at 400 degrees Celsius for 10 minutes (see Table 1). Moreover, as Example 1-(4), Ar plasma irradiation was performed under the same condition as in Example 1-(2), and an RTA process was then performed in the nitrogen atmosphere at 400 degrees Celsius for 10 minutes (see Table 1). Also in the manufacturing methods for the above-stated Examples 1-(3) and 1-(4), the steps other than the above are the same or alike as those shown in FIGS. 2 and 3. The process conditions for the above-stated Examples 1-(3) and 1-(4) are also shown in Table 1.

Now, the description goes back to the process of manufacturing the nonvolatile memory device 10.

FIG. 3 shows, in (d), a cross-sectional view obtained after a step of forming a second electrode material layer 107M. In this step, on the tantalum oxide material layer 106bA, iridium (Ir) is formed by sputtering as the second electrode material layer 107M. The second electrode material layer 107M is a thin film which is supposed to go through patterning and eventually becomes the second electrode layer 107, and thus is included in the second electrode layer 107.

FIG. 3 shows, in (e), a cross-sectional view obtained after a step of forming the variable resistance element 112. In this step, the first electrode material layer 105M, the tantalum oxide material layers 106aF and 106bA, and the second electrode material layer 107M are treated with patterning and dry etching in which a mask is used. By doing so, the variable resistance element 112 including the first electrode layer 105, the first variable resistance layer 106a, the second variable resistance layer 106b, and the second electrode layer 107 is formed. The method of forming the variable resistance element 112 is not limited to the method of forming the first electrode material layer 105M, the first tantalum oxide material layer 106aF, the second tantalum oxide material layer 106bF, and the second electrode material layer 107M at the same time through patterning and dry etching; these layers may be formed separately.

Furthermore, upon forming the variable resistance element 112, the first electrode material layer 105M, the first tantalum oxide material layer 106a, the second tantalum oxide material layer 106bF, and the second electrode material layer 107M do not always need to be treated with patterning. For example, also in the case of forming a hole-filling variable resistance element by embedding part or all of these layers in the hole of the interlayer dielectric layer, the above embodiment is applicable.

FIG. 3 shows, in (f), a cross-sectional view obtained after a step of forming the second interlayer dielectric layer 108 (with a thickness of 500 to 1000 nm) so as to cover the variable resistance element 112. After forming the second interlayer dielectric layer 108 in this step, thermal treatment is performed on the resultant object for 10 minutes in a furnace heated to 400 degrees Celsius, for example, in order to reduce residual stress of the second interlayer dielectric layer 108 and to remove moisture remaining in the second interlayer dielectric layer 108.

FIG. 3 shows, in (g), a cross-sectional view obtained after a step of forming the second contact hole 109 and the second contact plug 110. In this step, the second contact hole 109 and the second contact plug 110 are formed in the same or like manufacturing method as in (a) to (e) of FIG. 2. After this step, the second line 111 is formed so as to cover the second contact plug 110. After the second line 111 is formed, thermal treatment is performed for 10 minutes in the furnace heated to 400 degrees Celsius, for example, in order to prevent erosion of aluminum included in the second line 111, and the nonvolatile memory device 10 is completed.

The method of manufacturing the nonvolatile memory device 10 in this embodiment includes, in the steps shown in (f) and (g) of FIG. 3, a step of performing thermal treatment for 10 minutes in the furnace heated to 400 degrees Celsius, for example, as mentioned above. Through this thermal treatment, a heat budget is given to the variable resistance element 112. It is to be noted that the manufacturing method in the present invention does not always need the above-mentioned thermal treatment. An advantageous effect of the present invention is to produce its advantageous effect even against the heat budget generated by introducing steps other than the above thermal treatment and the heat budget added due to other various causes. Although Examples, Reference Example, and Comparative Example are described based on the heat budget generated in the above-mentioned thermal treatment, this is an example for explanation to which the present invention is not limited.

TABLE 1

| Example No. | Ar plasma treatment after formation of second variable resistance layer | Ar + O₂ plasma treatment after formation of second variable resistance layer | Thermal treatment after formation of second variable resistance layer |
|---|---|---|---|
| Example 1-(1) | Excitation power: 500 W Power applied to substrate: 0 W | Not performed | Not performed |
| Example 1-(2) | Excitation power: 500 W Power applied to substrate: 20 W | Not performed | Not performed |

TABLE 1-continued

| Example No. | Ar plasma treatment after formation of second variable resistance layer | Ar + O$_2$ plasma treatment after formation of second variable resistance layer | Thermal treatment after formation of second variable resistance layer | |
|---|---|---|---|---|
| Example 1-(3) | Excitation power: 500 W Power applied to substrate: 0 W | Not performed | 10 minutes at 400° C. in N$_2$ atmosphere | |
| Example 1-(4) | Excitation power: 500 W Power applied to substrate: 20 W | Not performed | 10 minutes at 400° C. in N$_2$ atmosphere | |
| Example 2-(1) | Excitation power: 500 W Power applied to substrate: 20 W | Excitation power: 500 W Power applied to substrate: 20 W | 10 minutes at 400° C. in N$_2$ atmosphere | |
| Example 3-(1) | Excitation power: 500 W Power applied to substrate: 20 W | Excitation power: 500 W Power applied to substrate: 20 W | 10 minutes at 400° C. in N$_2$ atmosphere | Two repetitions of steps for second variable resistance layer |
| Comparative Example H-(1) | Not performed | Not performed | Not performed | |
| Reference Example H-(2) | Not performed | Not performed | 10 minutes at 400° C. in N$_2$ atmosphere | |

[Inhibitory Effect on Degradation of Oxygen Concentration Profile]

Figure 4A:
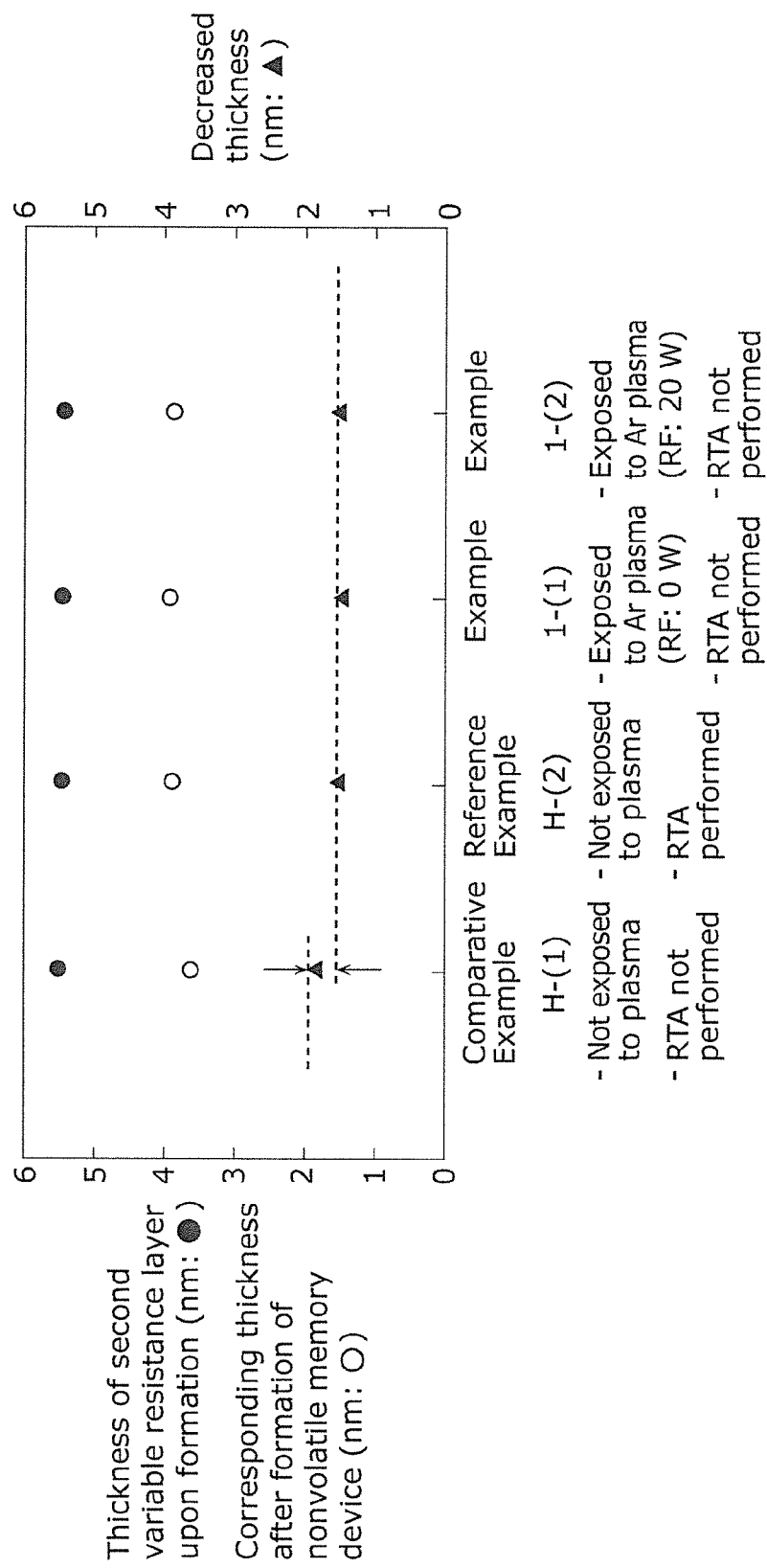
FIG. 4A is a graph showing comparison of decreased thicknesses of a second variable resistance layer in Examples, Comparative Example, and Reference Example, according to Embodiment 1 of the present invention.

FIG. 4A is a graph showing comparison of decreased thicknesses of the second variable resistance layer in Examples, Comparative Example, and Reference Example, according to Embodiment 1 of the present invention. In this figure, the decreased thicknesses of the second variable resistance layer in the above-stated Example 1-(1), Example 1-(2), Comparison Example H-(1), and Reference Example H-(2) are compared to one another. In the graph of FIG. 4A, the vertical axis on the left represents a thickness of the second variable resistance layer 106b upon formation (a black circle in FIG. 4A) and a thickness of the second variable resistance layer 106b calculated based on electrical properties after completion of the nonvolatile memory device (a white circle in FIG. 4A). Here, the thickness of the second variable resistance layer 106b calculated based on electrical properties indicates a corresponding thickness of the second variable resistance layer 106b which is obtained by calculation using the initial resistance value of the second variable resistance layer 106b after completion of the nonvolatile memory device.

Here, a method of calculating the corresponding thickness of the second variable resistance layer 106b is described.

Figure 5:
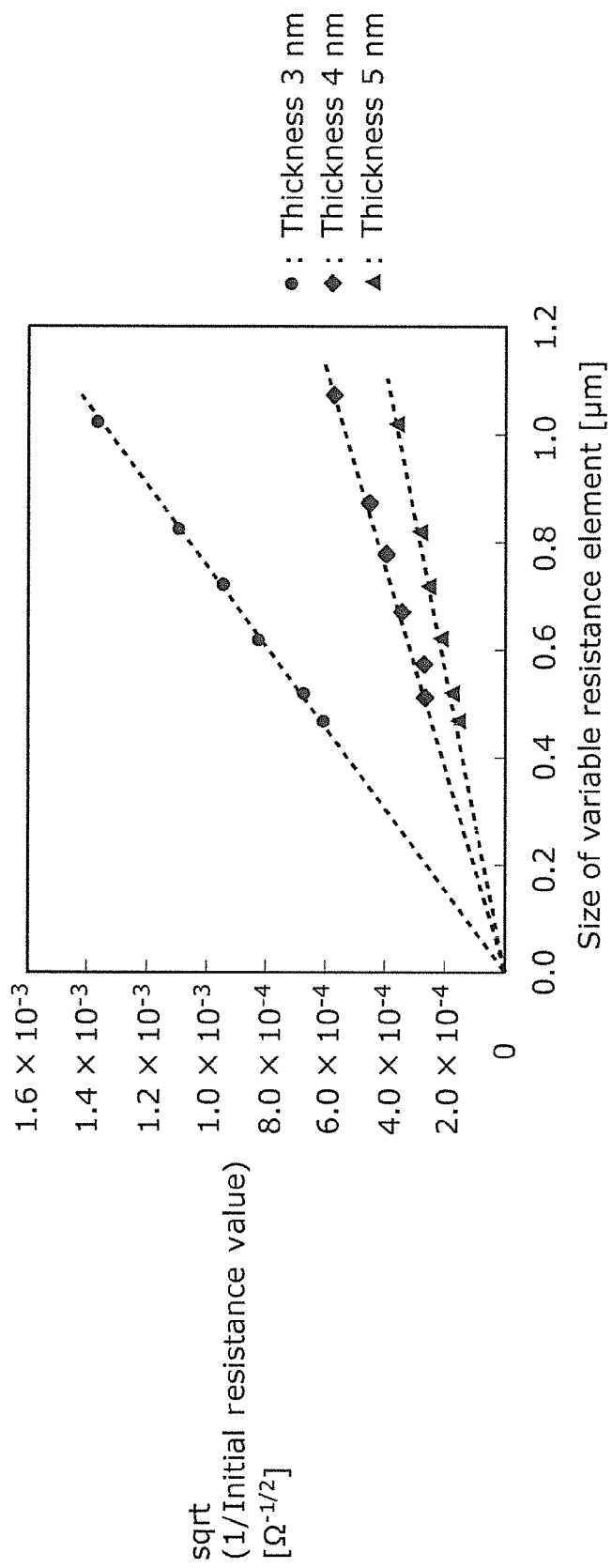
FIG. 5 shows a relationship between a size and the square root of the reciprocal of an initial resistance value of a variable resistance element formed without thermal treatment.

FIG. 5 shows a relationship between a size and the square root of the reciprocal of an initial resistance value (hereinafter represented as $(1/\rho)^{1/2}$) of the variable resistance element 112 formed without thermal treatment. In the example shown in FIG. 5, no degradation of the oxygen concentration profile occurs since the thermal treatment is not performed on the variable resistance element. In FIG. 5, a relationship between a size and $(1/\rho)^{1/2}$ of the variable resistance element 112 is shown for each of the following thicknesses of the second variable resistance layer 106b: 3 nm (black circles in FIG. 5), 4 nm (black rhombuses in FIG. 5), and 5 nm (black triangles in FIG. 5). Here, the size of the variable resistance element 112 represented by the horizontal axis of FIG. 5 indicates a length of one side of the variable resistance element 112 having a square shape in planar view.

The result of FIG. 5 shows that the relationship of $(1/\rho)^{1/2}$ to the size of the variable resistance element 112 is linear and a gradient thereof is different according to a thickness of the second variable resistance layer 106b. The gradient at the point of linear approximation of the size and $(1/\rho)^{1/2}$ of the variable resistance element 112 is hereinafter denoted by g.

Figure 6:
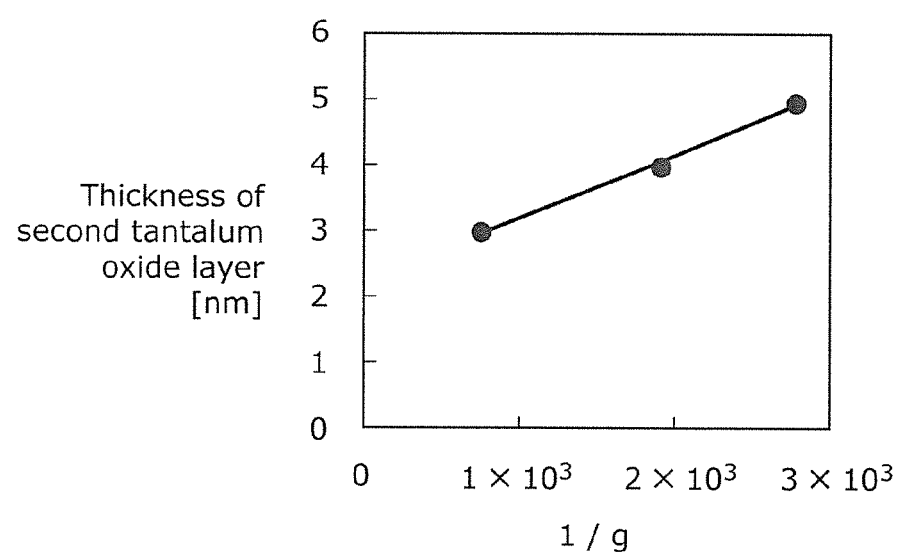
FIG. 6 shows a relationship between the reciprocal of the gradient of the square root of the reciprocal of an initial variable resistance of a variable resistance element and a thickness of a second tantalum oxide layer.

FIG. 6 shows a relationship between the reciprocal (1/g) of the gradient (g) of the square root of the reciprocal of an initial variable resistance of the variable resistance element 112 and a thickness of the second variable resistance layer 106b. From FIG. 6, it can be seen that the thickness of the second variable resistance layer 106b has a linear relationship to the reciprocal of g. Here, assuming that the thickness of the second variable resistance layer 106b with its oxygen concentration profile degraded due to the thermal treatment is represented in the same or like manner on the straight line shown in FIG. 6, then an effective thickness $D_a$ of the second variable resistance layer 106b can be defined using an expression of the straight line shown in FIG. 6, that is, the following Expression (1).

$$d_a = 9.84 \times 10^{-4} \times (1/g) + 2.21 \quad (1)$$

Here, $d_a$ represents an effective thickness of the second variable resistance layer 106b. In other words, the effective thickness indicates a corresponding thickness of the second variable resistance layer 106b in the variable resistance element 112 which is assumed to be not subject to annealing, calculated from a thickness of the annealed second variable resistance layer 106b based on the initial resistance value of the annealed second variable resistance value 106b. A degree of degradation of the oxygen concentration profile can be evaluated using the effective thickness $d_a$ of the second variable resistance layer 106b indicated by Expression (1). This effective thickness $d_a$ is a corresponding thickness of the second variable resistance layer 106b which is obtained by calculation using the initial resistance value of the second variable resistance layer 106b after completion of the nonvolatile memory device.

Returning to FIG. 4A, the results of Examples, Comparative Example, and Reference Example are described. In the graph of FIG. 4A, the vertical axis on the right represents a difference between a thickness of the second variable resistance layer 106b upon formation and a thickness of the second variable resistance layer 106b calculated based on electrical properties after completion of the nonvolatile memory device 10, that is, a decreased thickness of the second variable resistance layer 106b (a black triangle in FIG. 4A). This decreased thickness indicates, in other words, a value corresponding to an amount of oxygen diffused from the second variable resistance layer 106b, and this value being large indicates that the oxygen in the second variable resistance layer 106b diffuses, resulting in the second variable resistance layer 106b after formation of the nonvolatile memory device 10 being reduced in thickness. It is to be noted that the thickness of the second variable resistance layer 106b upon formation and the thickness of the second variable resistance layer 106b calculated from electrical properties are measured using different methods and therefore, the absolute value of a difference therebetween does not represent an actual decreased thickness, strictly speaking, but it is conceivable that a difference in the decreased thickness between the conditions represents a difference of oxygen content of the second variable resistance layer 106b.

Comparative Example H-(1) is a sample obtained by forming a high resistance layer, i.e., the tantalum oxide material layer 106bF, and then directly depositing an Ir electrode thereon. As indicated in Comparative Example H-(1), the thickness which was 5.5 nm at the time of formation of the tantalum oxide material layer 106bF (the thickness upon formation) decreased to 3.6 nm, which was a thickness evaluated from electrical properties after formation of the nonvolatile memory device 10 (the thickness after completion). Thus, the decreased thickness of the second variable resistance layer 106b was 1.9 nm.

Reference Example H-(2) is a sample obtained by performing thermal treatment at 400 degrees Celsius for 10 minutes in the nitrogen atmosphere after forming the tantalum oxide material layer 106bF. As indicated in Reference Example H-(2), the thickness at the time of formation of the tantalum oxide material layer 106bF was 5.5 nm, but the thickness evaluated from electrical properties after formation of the device was 3.9 nm. Thus, the decreased thickness of the second variable resistance layer 106b was 1.6 nm. This shows that performing the thermal treatment at 400 degrees Celsius for 10 minutes in the $N_2$ atmosphere after forming a high resistance layer, i.e., the tantalum oxide material layer 106bF, reduces the decreased thickness of the second variable resistance layer 106b by the order of 0.3 nm. This result suggests that giving heat at 400 degrees Celsius for 10 minutes after the tantalum oxide material layer 106bF is formed causes an unbound part of Ta and O in the layer to be bound, which changes the layer quality so that, even with a heat budget added in the subsequent steps, the oxygen in the second variable resistance layer 106b is difficult to diffuse. However, as described above, the RTA at 400 degrees Celsius has an inhibitory effect on oxygen diffusion because of the Ta—O bond being strengthened, but simultaneously causes the oxygen diffusion to progress.

In view of the above result, the inventors of the present invention supposed that giving energy to the high resistance layer, i.e., the tantalum oxide material layer 106bF, without application of heat thereto is effective. The manufacturing method according to Embodiment of the present invention includes, as described above, generating noble gas plasma comprising argon (Ar), krypton (Kr), xenon (Xe), and helium (He) and causing $Ar^+$, $Kr^+$, $Xe^+$, and $He^+$ in the plasma to collide with a film surface of the tantalum oxide material layer 106bF, thereby supplying energy.

Here, conditions for the plasma irradiation performed after formation of the tantalum oxide material layer 106bF in Example are described. The gas used to generate the plasma was Ar gas, a flow rate thereof was 100 sccm, and the chamber pressure was set to 3 Pa. The power at the main power supply for generating the plasma was set to 500 W, and process time was set to 5 minutes. Furthermore, in order to change the energy for attracting Ar ions, the RF power at the power supply for substrate bias was set to 0 W in Example 1-(1) and the RF power at the power supply for substrate bias was set to 20 W in Example 1-(2).

As shown in FIG. 4A, results of both Example 1-(1) and Example 1-(2) are substantially identical to a result of Reference Example H-(2) in which the thermal treatment at 400 degrees Celsius for 10 minutes was performed. This indicates that performing the plasma irradiation step using a noble gas such as Ar after forming a high resistance layer, i.e., the tantalum oxide material layer 106bF, produces an inhibitory effect on oxygen diffusion the degree of which is the same or like as in the case where the thermal treatment at 400 degrees Celsius for 10 minutes is performed after formation of the tantalum oxide material layer 106bF. In other words, Examples show that supplying energy of noble gas ions in the plasma to the high resistance layer, i.e., the tantalum oxide material layer 106bF, improves the quality of the second variable resistance layer 106b and thereby allows a reduction in the occurrence of oxygen diffusion from the resultant second variable resistance layer 106b. Furthermore, the plasma irradiation step can be performed at lower temperature than the thermal treatment, which is also effective from the perspective of low-temperature process. Since the decreased thicknesses in the experiment results of Example 1-(1) and Example 1-(2) are substantially the same, the RF power for attracting Ar ions may either be applied or not be applied. However, the RF power at the power supply for substrate bias beyond 50 W results in the tantalum oxide material layer 106bF being etched; in order to avoid this, a condition under which the tantalum oxide material layer 106bF is not etched by the noble gas plasma is preferred, such as a condition in which the RF power is at least 0 W and at most 50 W in the above example.

Figure 4B:
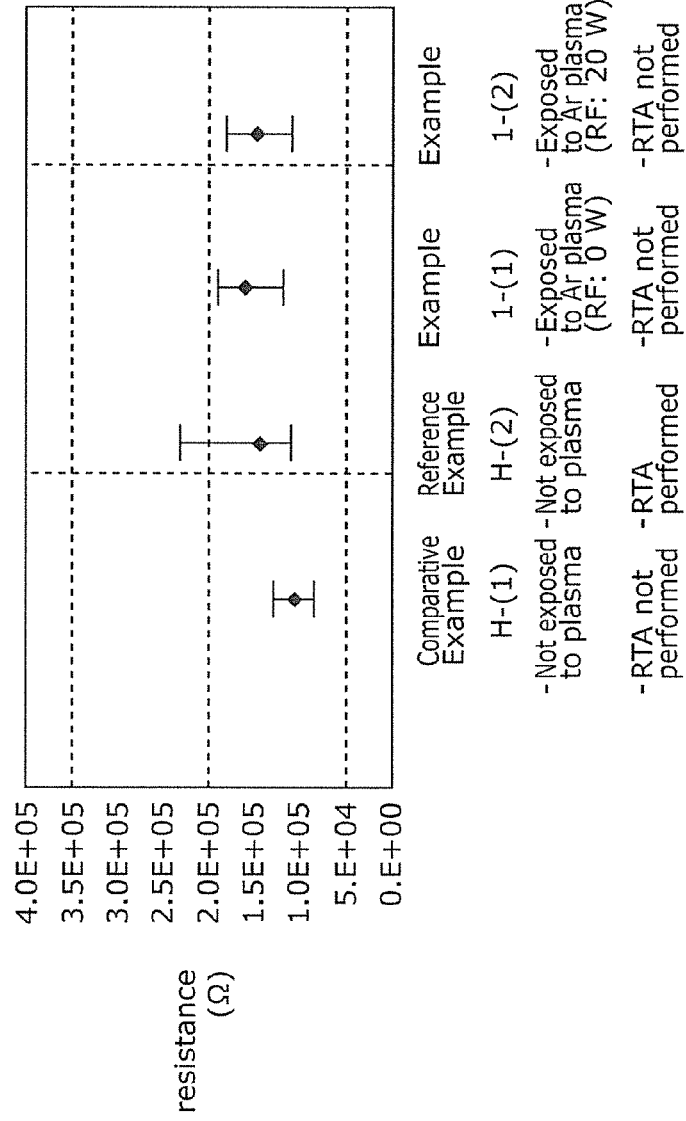
FIG. 4B is a graph showing variations in the initial resistance of a variable resistance element after formation of the nonvolatile memory device in the Examples, Comparative Example, and Reference Example, according to Embodiment 1 of the present invention.

FIG. 4B is a graph showing variations in the initial resistance of a variable resistance element after formation of the nonvolatile memory device in the Examples, Comparative Example, and Reference Example, according to Embodiment 1 of the present invention. It can be seen that, in the nonvolatile memory device shown in Reference Example H-(2), the decreased thickness of the second variable resistance layer is reduced by the thermal treatment, but the initial resistance varies a lot due to the thermal treatment. It can also be seen that, in contrast, in Example 1-(1) and Example 1-(2) where the irradiation with noble gas plasma was performed at room temperature, the variations in initial resistance are lesser than in Reference Example H-(2).

It is to be noted that the above-described effect is not obtained only in the case where the plasma gas is Ar; other noble gases may be used. This is because the present invention is implemented by irradiating a film surface of a high resistance layer, i.e., the tantalum oxide material layer 106bF, with ions in the noble gas plasma, and supplying the energy of such ions, thereby reducing the occurrence of oxygen diffusion from the second variable resistance layer 106b. Thus, in Embodiment of the present invention, the same or like advantageous effect can be produced even when ions of the noble gas other than Ar gas, such as Kr, Xe, He, and Ne are used.

Energy given to the film surface by each of the noble gas elements is different according to a difference in collision cross-sectional area, but it is possible to produce the same or like effect through adjustment to the power at the power supply for generating the plasma.

As above, in the method of manufacturing the nonvolatile memory device 10 according to this embodiment, the occurrence of diffusion of the oxygen in the tantalum oxide material layer 106bF into the tantalum oxide material layer 106aF or the second electrode material layer 107M can be reduced, with the result that the decrease in the effective thickness of the second variable resistance layer 106b can be reduced. Thus, the degradation of the oxygen concentration profile of the variable resistance layer 106 is inhibited, which can improve the device performance of the variable resistance element 112. Furthermore, the reduced variations in device performance can lead to a reduction in the variations of voltage which is applied to the variable resistance layer 106, with the result that high endurance characteristics can be provided.

Furthermore, in the manufacturing method according to this embodiment comprising the step of exposure to the plasma generated from a single kind of noble gas, the processing can be performed with a wafer maintained at relatively low temperature (e.g., room temperature), which enables low-temperature process.

Furthermore, in the manufacturing method according to this embodiment, it is assumed that a tiny amount of gas which is not the noble gas for generating the plasma is contained in a vacuum plasma chamber. The above tiny amount of gas includes, for example, gas which is previously attached to an inner sidewall of the vacuum plasma chamber and then mixed with the plasma at the time of generating the plasma, and gas contained depending on the purity of the noble gas at a supply source. An embodiment in which such a tiny amount of gas is present in the plasma is also included in the manufacturing method according to Embodiment 1 of the present invention since the tiny amount of gas does not contribute to the generation of plasma.

(Embodiment 2)
[Structure of Nonvolatile Memory Device]

The inventors did further research on an approach in which the occurrence of oxygen diffusion is reduced. As a result, the inventors found that, by introducing oxygen into an oxygen defect site that is a site where oxygen is desired to be present, but is missing, in a high resistance layer, i.e., the tantalum oxide material layer, it is possible to reliably bind oxygen and Ta and thereby reduce the occurrence of oxygen diffusion. Although the high resistance layer, i.e., the tantalum oxide material layer, has a stoichiometric composition $Ta_2O_5$ in a macroscopic view, the tantalum oxide material layer includes oxygen deficiency in a statistical view and in a microscopic view. From this perspective, the inventors came up with the idea of depositing the high resistance layer, i.e., the tantalum oxide material layer, and then exposing the tantalum oxide material layer to mixture plasma made of a noble gas, such as Ar, and oxygen, to supplement an oxygen defect site with oxygen to build a Ta—O bond, thereby improving the quality of the tantalum oxide material layer.

A nonvolatile memory device according to Embodiment 2 of the present invention is the same in structure as the nonvolatile memory device 10 according to Embodiment 1, but is different therefrom in how to improve the quality after formation of the tantalum oxide material layer that eventually becomes the second variable resistance layer. Although details are described later, the tantalum oxide layer, that is, the second variable resistance layer, is exposed to $Ar/O_2$ plasma after the tantalum oxide material layer is deposited by sputtering, with the result that the occurrence of diffusion of the oxygen in the second variable resistance layer due to a heat budget generated in the subsequent steps such as the element-forming step can be reduced.

[Method of Manufacturing Nonvolatile Memory Device]

Figure 7:
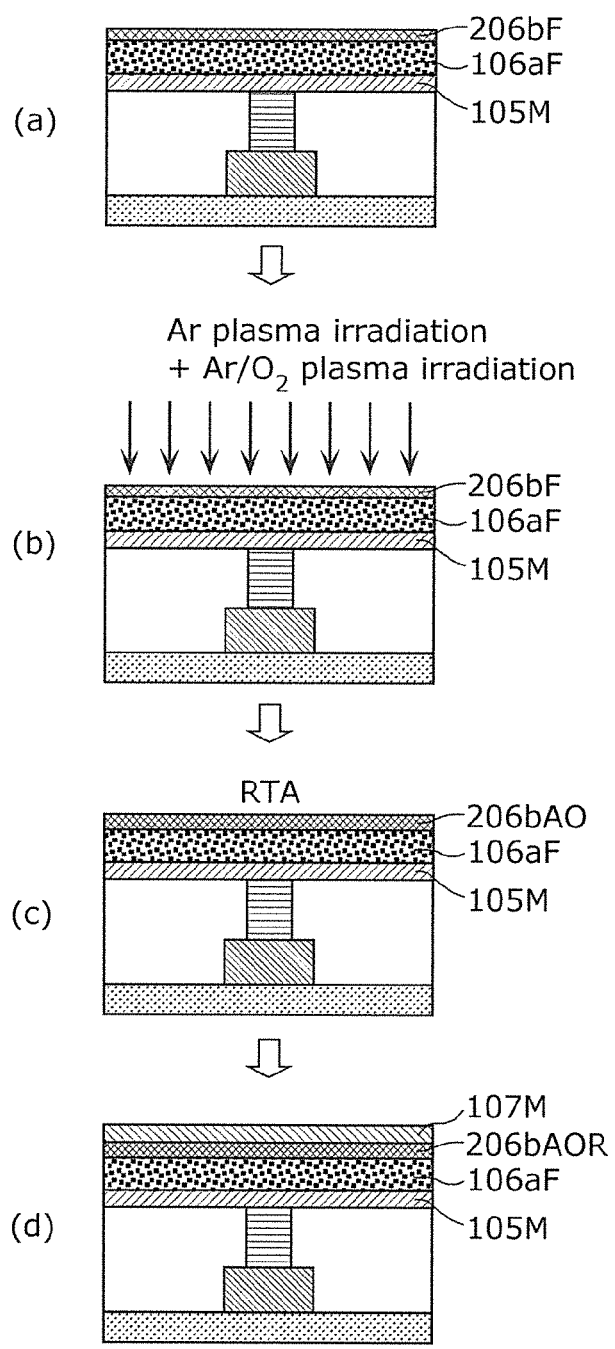
FIG. 7 consists of (a) to (d) which are cross-sectional views showing a main part of a method of manufacturing a nonvolatile memory device according to Embodiment 2 of the present invention.

FIG. 7 is cross-sectional views showing a main part of a method of manufacturing a nonvolatile memory device according to Embodiment 2 of the present invention. With reference to these views, the method of manufacturing a main part of the nonvolatile memory device according to Embodiment 2 is described. The method of manufacturing the nonvolatile memory device according to this embodiment is different from the method of manufacturing the nonvolatile memory device 10 according to Embodiment 1 shown in FIGS. 2 and 3 in the step of exposing to plasma a tantalum oxide material layer 206bF that eventually becomes the second variable resistance layer, after forming the tantalum oxide material layer 206bF by sputtering, and in that an RTA process follows. Descriptions on the same points as the manufacturing method according to Embodiment 1 are omitted, and the steps following forming the tantalum oxide material layer 206bF by sputtering are described below. It is to be noted that the following description shows mere examples in which particular materials, processing methods, and process conditions are illustrative and not restrictive. The following manufacturing method is applicable in combination with a known method.

As shown in (a) of FIG. 7, the tantalum oxide material layer 206bF that eventually becomes the second variable resistance layer is formed under the same sputtering condition as in Embodiment 1.

FIG. 7 shows, in (b), a cross-sectional view for the step of irradiating a surface of the tantalum oxide material layer 206bF with Ar plasma and $Ar/O_2$ plasma. In this step, Ar plasma treatment is performed on the surface of the tantalum oxide material layer 206bF using the plasma treatment device used in Embodiment 1, and $Ar/O_2$ plasma treatment is subsequently performed. This processing is performed in the following flow.

First, in an Ar plasma irradiation step, the surface of the tantalum oxide material layer 206bF is exposed to Ar plasma for 5 minutes. The condition for this step is, for example, a room temperature for the substrate temperature at the time of the process, 500 W for power at the power supply for generating the plasma, 20 W for power at a power supply for substrate bias, 3 Pa for a pressure, Ar=100 sccm for a gas flow rate, and 5 minutes for process time. This Ar plasma irradiation step corresponds to single-gas plasma treatment of exposing the surface of the tantalum oxide material layer 206bF to plasma generated from a single kind of noble gas. The above conditions are the conditions applied in Embodiment 1 of the present invention (Example 1-(2)) which shows that, through this step, the occurrence of diffusion of the oxygen in the second variable resistance layer 106b into the first variable resistance layer 106a can be reduced.

Subsequent to this Ar plasma irradiation step, an $Ar/O_2$ plasma irradiation step is performed. In the $Ar/O_2$ plasma irradiation step, the plasma state changes to a next condition sequentially in the state where the plasma is generated, that is, without the power supply for generating the plasma and the power supply for applying the substrate bias being turned off. The condition for this is, for example, a room temperature for the substrate temperature at the time of the process, 500 W for power at the power supply for generating the plasma, 20 W for power at an RF power supply, 4 Pa for a pressure, Ar=95 sccm and $O_2$=5 sccm for gas flow rates, and 3 minutes for process time. Under the above conditions, the surface of the tantalum oxide material layer 206bF is exposed to the Ar/O$_2$ plasma so that the tantalum oxide material layer 206bF improves in quality to result in the tantalum oxide material layer 206bAO with oxygen defect sites supplemented with oxygen. This Ar/O$_2$ plasma irradiation step corresponds to plasma treatment of exposing a surface of the tantalum oxide material layer 206bF to plasma generated from gas containing at least a noble gas, and further corresponds to mixture plasma treatment of exposing the surface of the tantalum oxide material layer 206bF to plasma generated from noble gas-oxygen mixture gas.

FIG. 7 shows, in (c), a cross-sectional view for an annealing step of heating the tantalum oxide material layer 206bA in a nitrogen gas atmosphere after the mixture plasma treatment. In this step, in order to bind yet-unbound oxygen failed to form a Ta—O bond out of the oxygen taken into the tantalum oxide material layer 206bAO that eventually becomes the second variable resistance layer, RTA at 400 degrees Celsius is performed for 10 minutes in the nitrogen atmosphere to improve the quality of the tantalum oxide material layer 206bAO that eventually becomes the second variable resistance layer. Although details are described later, the Ar/O$_2$ plasma irradiation step and the RTA subsequent to the Ar plasma irradiation cause the tantalum oxide material layer 206bAO to further improve in quality to result in the tantalum oxide material layer 206bAOR so that the occurrence of oxygen diffusion to the first variable resistance layer 106a from the second variable resistance layer 206b obtained by patterning at a subsequent step is further reduced.

Next, as shown in (d) of FIG. 7, iridium (Ir) is formed by sputtering as the second electrode material layer 107M on the tantalum oxide material layer 206bAOR in a step of forming the second electrode material layer 107M.

The subsequent manufacturing steps are the same or alike as the manufacturing steps shown in (e) to (g) of FIG. 3 in Embodiment 1. Therefore, descriptions on these steps are omitted.

Here, the manufacturing method according to Embodiment 2 was performed under the above-stated condition as Example 2-(1). Table 1 shows a process condition for Example 2-(1).

[Inhibitory Effect on Degradation of Oxygen Concentration Profile]

Figure 8:
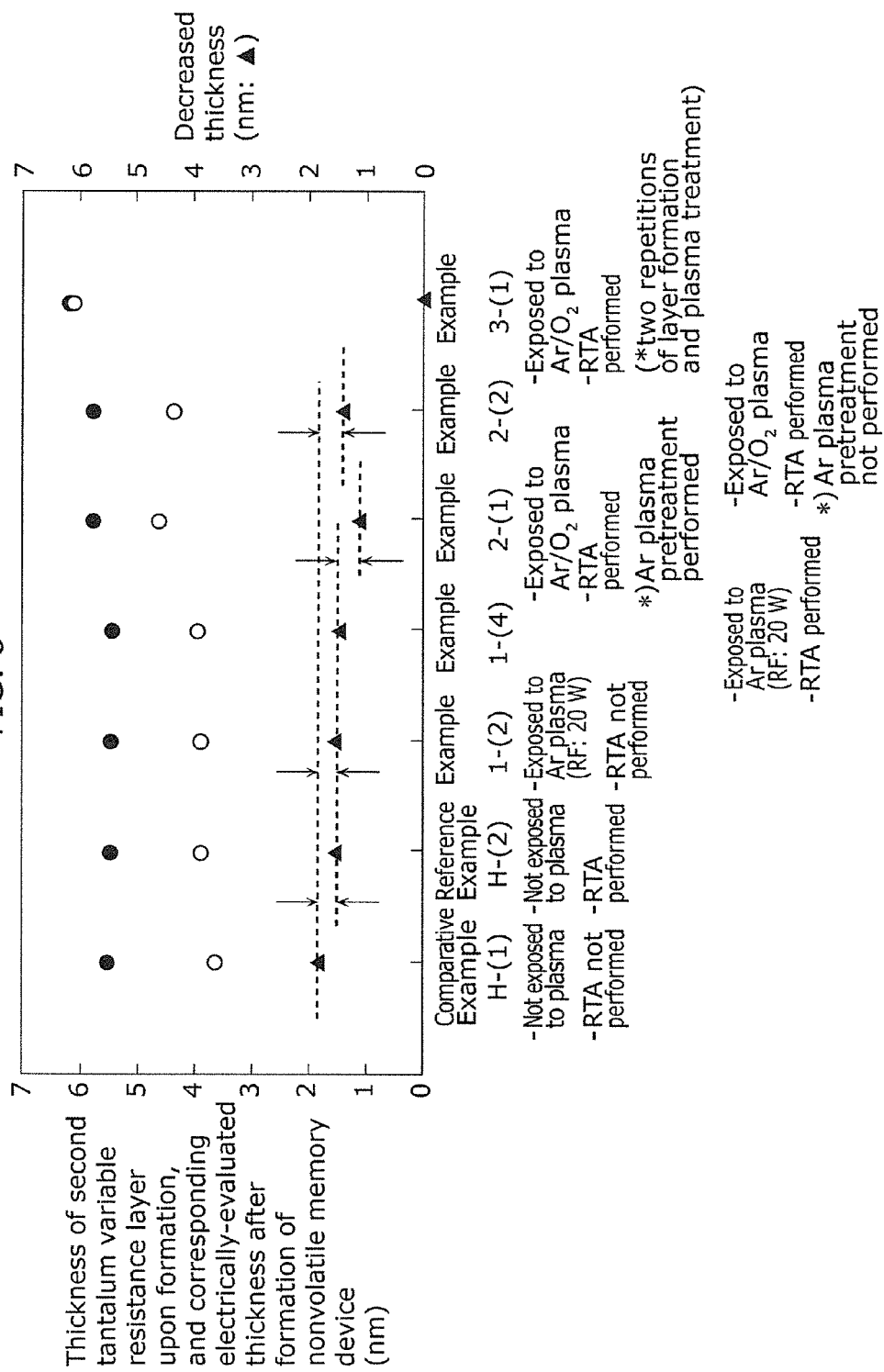
FIG. 8 is a graph showing comparison of decreased thicknesses of a second variable resistance layer in Embodiments 1 to 3 of the present invention.

FIG. 8 is a graph showing comparison of decreased thicknesses of the second variable resistance layer in Examples, Comparative Examples, and Reference Example, according to Embodiments 1 to 3 of the present invention. In this figure, the decreased thicknesses of the second variable resistance layer in not only Example 1-(2), Comparative Example H-(1), and Reference Example H-(2) according to Embodiment 1, but also Example 2-(1) according to Embodiment 2, are compared to one another. Descriptions on the results obtained from the graph of FIG. 4A are omitted here.

In Example 2-(1) according to this embodiment, the thickness of the tantalum oxide material layer 206bF that eventually becomes the second variable resistance layer was 5.3 nm at the time of its formation. Next, the thickness of the tantalum oxide material layer 206bAOR obtained through the above-described Ar plasma treatment and Ar/O$_2$ plasma treatment was 5.8 nm. The black circle sign in Example 2-(1) in the graph of FIG. 8 plots a thickness of 5.8 nm which is measured after completion of the Ar/O$_2$ plasma treatment. Subsequently, the RTA at 400 degrees Celsius is performed for 10 minutes in the nitrogen atmosphere, and iridium (Ir) is formed as the second electrode material layer 107M by sputtering. Consequently, the thickness of the second variable resistance layer which was evaluated from electrical properties after completion of the nonvolatile memory device in Example 2-(1) was 4.6 nm, which indicates that the decreased thickness was as small as 1.2 nm. The foregoing result shows that, because the second variable resistance layer is further supplied in advance with excess oxygen through the Ar/O$_2$ plasma irradiation and the RTA process after the Ar plasma irradiation is performed, there is an effect of reducing the occurrence of oxygen diffusion at the time of heat budget application in the subsequent steps, thereby further reducing the decreased thickness of the second tantalum oxide layer. Next, the fact that the Ar/O$_2$ plasma irradiation contributes to this effect is described below.

In Example 1-(4), the RTA process at 400 degrees Celsius was performed for 10 minutes in the nitrogen atmosphere after the Ar plasma irradiation was performed under the same condition as in Example 1-(2). As shown in FIG. 8, the decreased thicknesses in Example 1-(4) and Example 1-(2) are substantially the same, which indicates that the RTA at 400 degrees Celsius for 10 minutes in the N$_2$ atmosphere after the Ar irradiation does not increase the inhibitory effect on thickness decrease. It may therefore be concluded that the inhibitory effect on oxygen diffusion in Example 2-(1) which is higher than in Example 1-(2) is not due to the RTA process, but is due to the Ar/O$_2$ plasma treatment.

In Example 2-(1), the Ar plasma treatment is performed before the Ar/O$_2$ plasma treatment is performed, which is not a restrictive example to obtain the inhibitory effect on oxygen diffusion. FIG. 8 shows a result of Example 2-(2) where only the Ar/O$_2$ plasma treatment was performed. Here, a difference between the decreased thickness in Comparative Example H-(1) and the decreased thickness in Example 2-(2) corresponds to the inhibitory effect on oxygen diffusion which is due to the Ar/O$_2$ plasma treatment. The above difference in decreased thickness is larger than the difference between the decreased thickness in Comparative Example H-(1) and the decreased thickness in Example 1-(2), for example. This indicates that the inhibitory effect on oxygen diffusion due to the Ar/O$_2$ plasma treatment is higher than the effect due to the Ar plasma treatment. Furthermore, the difference between the decreased thickness in Comparative Example H-(1) and the decreased thickness in Example 2-(2) is substantially the same as the difference between the decreased thickness in Example 1-(2) and the decreased thickness in Example 2-(1). This indicates that the effect due to the Ar/O$_2$ plasma treatment can be obtained even without the Ar plasma treatment applied as pretreatment.

The above effect is not obtained only using Ar/O$_2$ gas; mixture gas of other noble gases and oxygen may be used. In this embodiment, the noble gas-oxygen mixture gas is used to cause the tantalum oxide in the high resistance layer, i.e., the second variable resistance layer, to be oxidized with oxygen ions and oxygen radicals from the film surface of the second variable resistance layer, and even in the case where ions of other noble gases than Ar gas, such as Kr, Xe, He, and Ne, are used, it is possible to produce such oxygen ions and oxygen radicals and therefore obtain the same or like effect.

As described above, in the method of manufacturing the nonvolatile memory device according to this embodiment, it is possible to reduce the occurrence of diffusion of the oxygen in the tantalum oxide material layer 206bF into the tantalum oxide material layer 106aF or the second electrode material layer 107M, thereby reducing the occurrence of decrease in effective thickness of the second variable resistance layer, after forming the tantalum oxide material layer 206bF that is the second oxide material layer. In this embodiment, the inhibitory effect is produced more efficiently than in the manufacturing method according to Embodiment 1. This is presumably because the inhibitory effect on oxygen diffusion develops by, using the plasma generated from the Ar/O$_2$ mixture gas, for example, introducing oxygen into the oxygen defect site which lacks oxygen in the second variable resistance layer and reliably binding the introduced oxygen to a tantalum element.

(Embodiment 3)
[Structure of Nonvolatile Memory Device]

The inventors did further research on an approach which makes it possible to reduce the occurrence of oxygen diffusion. As a result, the inventors found a method in which, upon forming the second variable resistance layer with a desired thickness, sputtering is performed several times to form the second variable resistance layer, and on each sputtering, a plasma oxidation process is performed on the target using the noble gas-oxygen mixture gas mentioned in Embodiment 2. Although details are described later, this allows a further reduction in the occurrence of oxygen diffusion from the second variable resistance layer which is due to a heat budget after formation of the variable resistance element.

Figure 9:
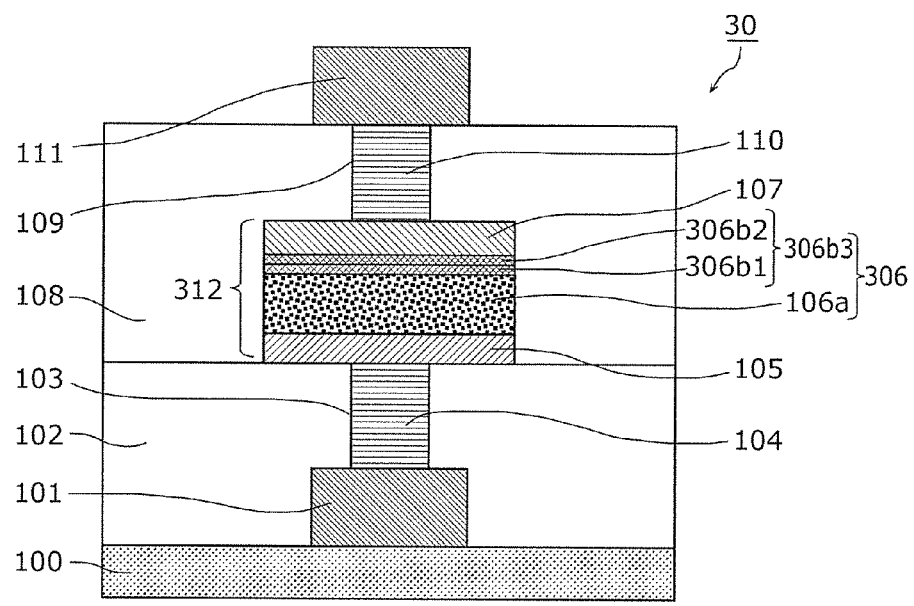
FIG. 9 is a cross-sectional view showing a schematic structure of a nonvolatile memory device according to Embodiment 3 of the present invention.

FIG. 9 is a cross-sectional view showing a schematic structure of a nonvolatile memory device according to Embodiment 3 of the present invention. A nonvolatile memory device 30 according to this embodiment, shown in this figure, is different from the nonvolatile memory device 10 according to Embodiment 1 in how to form the second variable resistance layer. Although details are described later, a second variable resistance layer 306b3 is the second oxide layer which includes a lower layer 306b1 and an upper layer 306b2, and these layers are formed step by step. Specifically, the lower layer 306b1 is deposited by sputtering, then the Ar/O$_2$ plasma treatment described in Embodiment 2 is performed, thereafter the upper layer 306b2 is deposited by sputtering, and the Ar/O$_2$ plasma treatment is performed again. Thus, the high resistance layer, i.e., the second variable resistance layer, is formed by two steps, and in each of the steps, the Ar/O$_2$ plasma treatment described in Embodiment 2 is performed. Subsequently, thermal treatment is performed through RTA, with the result that the second variable resistance layer 306b3 is formed. In the case where the second variable resistance layer 306b is manufactured in this method, it is possible to reduce the occurrence of diffusion of the oxygen in the second variable resistance layer 306b which is due to a heat budget in a step subsequent to formation of the variable resistance element.

[Method of Manufacturing Nonvolatile Memory Device]

Figure 10:
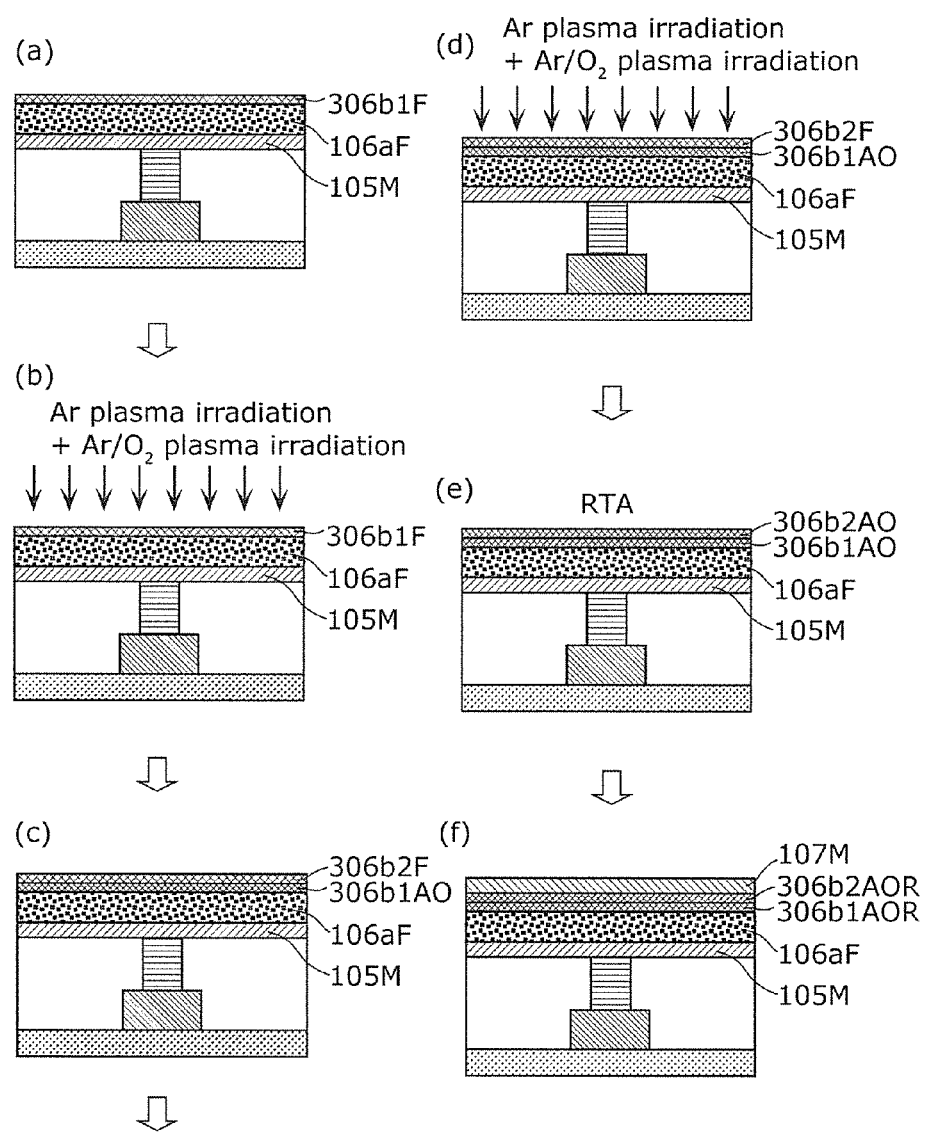
FIG. 10 consists of (a) to (f) which are cross-sectional views showing a main part of a method of manufacturing a nonvolatile memory device according to Embodiment 3 of the present invention.

FIG. 10 is cross-sectional views showing a main part of a method of manufacturing the nonvolatile memory device according to Embodiment 3 of the present invention. With reference to these views, the method of manufacturing a main part of the nonvolatile memory device according to Embodiment 3 is described. The method of manufacturing the nonvolatile memory device 30 according to this embodiment is different from the method of manufacturing the nonvolatile memory device 10 according to Embodiment 1 shown in FIGS. 2 and 3 in the step of forming the second variable resistance layer and in the step of performing processing thereon. Descriptions on the same points as the manufacturing method according to Embodiment 1 are omitted, and the steps following forming the tantalum oxide material layer 106aF that eventually becomes the first variable resistance layer that is a low resistance layer are described below. It is to be noted that the following description shows mere examples in which particular materials, processing methods, and process conditions are illustrative and not restrictive. The following manufacturing method is applicable in combination with a known method.

FIG. 10 shows, in (a), a cross-sectional view obtained after a first layer-forming step of forming the lower layer 306b1F. In this step, after the tantalum oxide material layer 106aF that is a low resistance layer and is the first oxide material layer is formed, the lower layer 306b1F comprising a tantalum oxide material of the second variable resistance layer is formed under the same sputtering conditions as in Embodiment 1 so as to have a thickness of 2.6 nm, for example. This way, the lower layer 306b1F is formed.

FIG. 10 shows, in (b), a cross-sectional view in the step of irradiating a surface of the lower layer 306b1F with Ar plasma and in the step of irradiating the surface of the lower layer 306b1F with Ar/O$_2$ plasma. In this step, the Ar plasma treatment is performed under the same condition as in Embodiment 1, and the Ar/O$_2$ plasma treatment is subsequently performed under the same condition as in Embodiment 2.

First, in the Ar plasma irradiation step, the Ar plasma treatment condition is a room temperature for the substrate temperature at the time of the process, 500 W, for example, for power at the power supply for generating the plasma, 20 W for power at the power supply for substrate bias, 3 Pa for a pressure, Ar=100 sccm for a gas flow rate, and 5 minutes for Ar plasma treatment time. This Ar plasma irradiation step corresponds to single-gas plasma treatment of exposing the surface of the lower layer 306b1F to plasma generated from a single kind of noble gas.

Subsequent to this Ar plasma irradiation step, an Ar/O$_2$ plasma irradiation step is performed. In the Ar/O$_2$ plasma irradiation step, the plasma state changes to a next condition sequentially, for example, in the state where the plasma is generated, that is, without the power supply for generating the plasma and the power supply for applying the substrate bias being turned off. The condition for this is, for example, a room temperature for the substrate temperature at the time of the process, 500 W for power at the power supply for generating the plasma, 20 W for power at an RF power supply, 4 Pa for a pressure, Ar=95 sccm and O$_2$=5 sccm for gas flow rates, and 3 minutes for process time. Through this process, the lower layer 306b1F becomes a lower layer 306b1AO on which the process has been performed, and the thickness of the lower layer 306b1AO is, for example, 4.7 mm. This Ar/O$_2$ plasma irradiation step corresponds to plasma treatment of exposing the surface of the lower layer 306b1F to plasma generated from gas containing at least a noble gas, and further corresponds to mixture plasma treatment of exposing the surface of the lower layer 306b1F to plasma generated from noble gas-oxygen mixture gas.

FIG. 10 shows, in (c), a cross-sectional view obtained after a first layer-forming step of forming the upper layer 306b2F. In this step, the upper layer 306b2F comprising a tantalum oxide material which becomes a structural element of the second variable resistance layer is deposited using a sputtering device so as to have a thickness of 0.7 nm. In this state, a total thickness of the upper layer 306b2F and the lower layer 306b1AO that becomes a structural element of the second variable layer is, for example, 5.4 nm.

FIG. 10 shows, in (d), a cross-sectional view in the step of irradiating a surface of the upper layer 306b2F with Ar plasma and in the step of irradiating the surface of the upper layer 306b2F with Ar/O$_2$ plasma. In this step, the Ar plasma treatment is performed under the same condition as in Embodiment 1, and the Ar/O$_2$ plasma treatment is subsequently performed under the same condition as in Embodiment 2.

First, in the Ar plasma irradiation step, the exposure to the Ar plasma continues for 5 minutes. The condition for this step is, for example, a room temperature for the substrate temperature at the time of the process, 500 W for power at the power supply for generating the plasma, 20 W for power at the power supply for substrate bias, 3 Pa for a pressure, Ar=100 sccm for a gas flow rate, and 5 minutes for process time. This Ar plasma irradiation step corresponds to single-gas plasma treatment of exposing the surface of the upper layer 306b2F to plasma generated from a single kind of noble gas.

Subsequent to this Ar plasma irradiation step, an Ar/$O_2$ plasma irradiation step is performed. In the Ar/$O_2$ plasma irradiation step, the plasma state changes to a next condition sequentially, for example, in the state where the plasma is generated, that is, without the power supply for generating the plasma and the power supply for applying the substrate bias being turned off. The condition for this is, for example, a room temperature for the substrate temperature at the time of the process, 500 W for power at the power supply for generating the plasma, 20 W for power at an RF power supply, 4 Pa for a pressure, Ar=95 sccm and $O_2$=5 sccm for gas flow rates, and 3 minutes for process time. Through this process, the upper layer 306b2F becomes an upper layer 306b2AO on which the process has been performed, and a total thickness of the lower layer 306b1AO and the upper layer 306b2AO is, for example, 6.2 nm. This Ar/$O_2$ plasma irradiation step corresponds to plasma treatment of exposing the surface of the upper layer 306b2F to plasma generated from gas containing at least a noble gas, and further corresponds to mixture plasma treatment of exposing the surface of the upper layer 306b2F to plasma generated from noble gas-oxygen mixture gas.

FIG. 10 shows, in (e), a cross-sectional view obtained after an annealing step of heating the lower layer 306b1AO and the upper layer 306b2A in a nitrogen gas atmosphere. In this step, in order to bind a yet-unbound Ta—O part using the oxygen taken into the lower layer 306b1AO and the upper layer 306b2AO, RTA at 400 degrees Celsius is performed for 10 minutes in the $N_2$ atmosphere. Although details are described later, it becomes possible to further reduce the occurrence of diffusion of the oxygen in the second variable resistance layer into the first variable resistance layer when a lower layer 306b1AOR and an upper layer 306b2AOR obtained by performing the RTA on the lower layer 306b1AO and the upper layer 306b2AO, respectively, become structural elements of the second variable resistance layer.

Next, as shown in (f) of FIG. 10, iridium (Ir) is formed by sputtering as the second electrode material layer 107M on the upper layer 306b2AOR in a step of forming the second electrode material layer 107M.

The subsequent steps are the same or alike as the manufacturing steps shown in (e) to (g) of FIG. 3, and the nonvolatile memory device 30 including a variable resistance element 312 is thus manufactured. Therefore, descriptions on these steps are omitted.

Here, the manufacturing method according to Embodiment 3 was performed under the above-stated condition as Example 3-(1). Table 1 shows a process condition for Example 3-(1).
[Inhibitory Effect on Degradation of Oxygen Concentration Profile]

The result of Example 3-(1) in Embodiment 3 of the present invention is shown in FIG. 8. In this figure, the decreased thicknesses of the second variable resistance layer in Example 1-(2), Comparison Example H-(1), and Reference Example H-(2) according to Embodiment 1, Example 2-(1) according to Embodiment 2, and Example 3-(1) according to Embodiment 3 are compared to one another. Descriptions on the results obtained from the graph of FIG. 4A are omitted here.

The black circle sign in Example 3-(1) in the graph of FIG. 8 plots a total thickness 6.2 nm of the lower layer 306b1AO and the upper layer 306b2AO for which the second Ar/$O_2$ plasma treatment shown in (d) of FIG. 10 has been completed. In this example, the thickness evaluated from electrical properties after completion of the nonvolatile memory device 30 was 6.2 nm. This shows that the decreased thickness is reduced by the Ar/$O_2$ plasma treatment. The above effect is not obtained only using Ar/$O_2$ gas; mixture gas of other noble gases and oxygen may be used. In the present invention, the noble gas-oxygen mixture gas is used to cause the tantalum oxide in the high resistance layer, i.e., the second variable resistance layer, to be oxidized with oxygen ions and oxygen radicals from the film surface of the second variable resistance layer, and even in the case where ions of other noble gases than Ar gas, such as Kr, Xe, He, and Ne, are used, it is possible to produce such oxygen ions and oxygen radicals and therefore obtain the same or like effect. It is to be noted that the above effect is obtained by two repetitions of the formation of the second variable resistance layer and the subsequent Ar/$O_2$ plasma treatment, but the repetitions may be three repetitions.

As above, in the method of manufacturing the nonvolatile memory device 30 according to this embodiment, the step of forming the second oxide material layers, i.e., the lower layer 306b1F and the upper layer 306b2F, and the plasma treatment of exposing the surface of these oxide material layers to plasma are repeated, which enables more effective restoration of an oxygen defect site. Thus, the process step which includes thermal treatment after the second variable resistance layers are deposited through the repetitions of the above steps allows a more effective reduction in oxygen diffusion from the second variable resistance layer into the first variable resistance layer or the second variable resistance layer 107M. This makes it possible to highly effectively reduce the decrease of an effective thickness of the second variable resistance layer. This is presumably because the step-by-step implementation of plasma irradiation across the second oxide material layer in its depth direction succeeded in effectively restoring the oxygen deficiency in the second variable resistance layer.

(Embodiment 4)
[Structure of Nonvolatile Memory Device]

The inventors of the present invention further found that depositing the high resistance layer, i.e., the second oxide material layer, and then exposing the second oxide material layer to plasma containing a noble gas to improve the quality of the second oxide material layer enables a decrease in the forming voltage, stabilization of the filament current, and enhancement of the endurance characteristics at the same time. This knowledge is described below with an example in which the second oxide material layer is a tantalum oxide material layer.

In the case where the second oxide material layer is an insulating layer or a very high resistance semiconductor layer, a forming process is performed as described later. The inventors of the present invention found that, in the forming process, the forming voltage can be lowered more for a tantalum oxide material layer formed as a deposited film than for a tantalum oxide material layer formed by oxidation. This is presumably because, although the second tantalum oxide material layer (the high resistance layer) formed as a deposited film has a stoichiometric composition $Ta_2O_5$ in a macroscopic view, the tantalum oxide material layer includes oxygen deficiency in a statistical view and in a microscopic view. In other words, for example, the second tantalum oxide material layer formed by oxidizing part of the first tantalum oxide material layer has a high film density than the second tantalum oxide material layer formed as a deposited film. Thus, the second tantalum oxide material layer formed as a deposited film has an advantage of a lowered forming voltage at the time of the forming process as compared to the tantalum oxide material layer formed by oxidation. Furthermore, the second tantalum oxide material layer formed as a deposited film has less variation in thickness and therefore less variation in the forming voltage as compared to the layer formed by oxidation.

Meanwhile, the second tantalum oxide material layer formed as a deposited film has a lower density than the layer formed by oxidation and therefore may have a degraded oxygen concentration profile due to a heat budget.

In contrast, the inventors of the present invention found that depositing the second tantalum oxide material layer and then exposing the tantalum oxide material layer to plasma containing a noble gas can lead to a lower forming voltage than the layer formed by oxidation and provide higher endurance characteristics than a conventional deposited film.

The following describes an example in which the high resistance layer, i.e., the tantalum oxide material layer is deposited and then exposed to mixture plasma made of a noble gas, such as Ar, and oxygen.

[Filament Formation]

Filament formation in the high resistance layer is described below. In the nonvolatile memory device 10 shown in FIG. 1, no resistance changing operation occurs immediately after manufacture in the case where the second variable resistance layer 106b is made of an insulator. Thus, the forming process is performed on this nonvolatile memory device 10 immediately after manufacture. It is to be noted that "immediately after manufacture" indicates a point in time after formation of the variable resistance element 112 and when no electric pulse has been applied yet to the variable resistance element 112 for a purpose other than the purpose of reading a resistance value. The "forming process" indicates an initialization process which is performed on the variable resistance element 112. Specifically, this is a process of electrically breaking down a transition metal oxide for changing the variable resistance element 112 from an initial state to a state where the variable resistance element 112 can reversibly change between a high resistance state and a low resistance state depending on a pulse voltage applied. The forming is also referred to as initial breakdown.

In the forming process, a predetermined voltage is applied to the variable resistance element to electrically break down the transition metal oxide so that a filament (a conductive path) is formed inside the second variable resistance layer 106b. The voltage which is applied at this time is referred to as "a forming voltage" (or an initialization voltage). By applying the forming voltage, it is possible to change the variable resistance element 112 to the state where the variable resistance element 112 can reversibly change between a high resistance state and a low resistance state depending on a pulse voltage applied.

Figure 11:
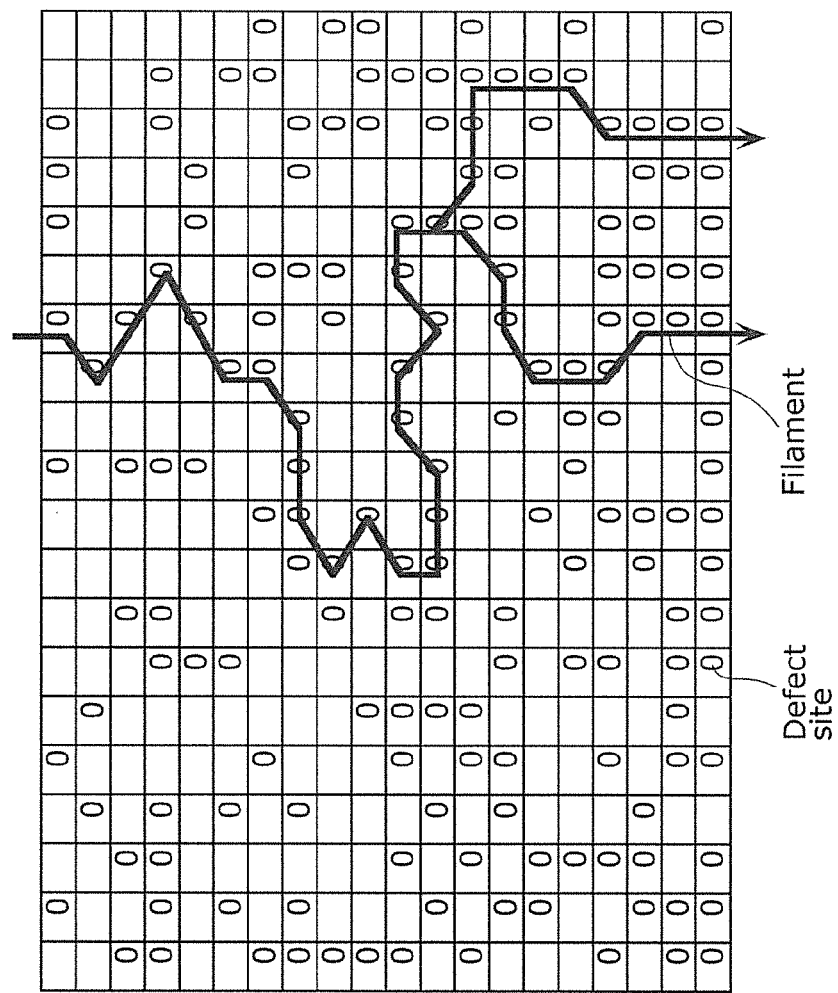
FIG. 11 is a view for explaining formation of a filament in a variable resistance layer.

FIG. 11 is a view for explaining formation of the filament in the variable resistance layer and shows a result of a simulation in which a percolation model is used. Here, it is assumed that oxygen defect sites in the second variable resistance layer 106b in the nonvolatile memory device 10 shown in FIG. 1 are connected to form the filament (the conductive path). The percolation model is a model based a theory that, assuming a random distribution of oxygen defect sites (hereinafter referred to simply as "defect sites") or the like in the second variable resistance layer 106b, the probability of connection of the defect sites or the like increases when the density of the defect sites or the like exceeds a certain threshold. Here, "defect" means that oxygen is deficient in the transition metal oxide, and "the density of the defect sites" corresponds to oxygen deficiency. Specifically, as the degree of oxygen deficiency increases, the density of the defect sites also increases.

Here, on an approximate assumption that oxygen ion sites in the second variable resistance layer 106b are sites arranged in a lattice pattern, a filament formed through stochastically-formed defect sites is determined in a simulation. In FIG. 11, the site in which "0" is included indicates the defect site which is formed in the second variable resistance layer 106b. On the other hand, a blank site indicates a site occupied by an oxygen ion, which means a high resistance site. Furthermore, a cluster of defect sites denoted by arrows (a set of defect sites connected to one another) indicates the filament, that is, the path through which current flows inside the second variable resistance layer 106b when a voltage is applied in the vertical direction of this figure. As shown in FIG. 11, the filament through which current flows between the lower and upper surfaces of the second variable resistance layer 106b is made of the cluster of the defect sites which connect the upper end to the lower end of a random distribution of defect sites. The use of this percolation model leads to stochastic formation as to the number of filaments and the shape of each filament.

[Method of Manufacturing Nonvolatile Memory Device]

The method of manufacturing a nonvolatile memory device according to Embodiment 4 of the present invention. The method of manufacturing a nonvolatile memory device according to Embodiment 4 includes the above-described forming step at the end of the method of manufacturing a nonvolatile memory device according to Embodiment 2. Differences from the method of manufacturing a nonvolatile memory device according to Embodiment 2 are mainly described below.

Figure 12:
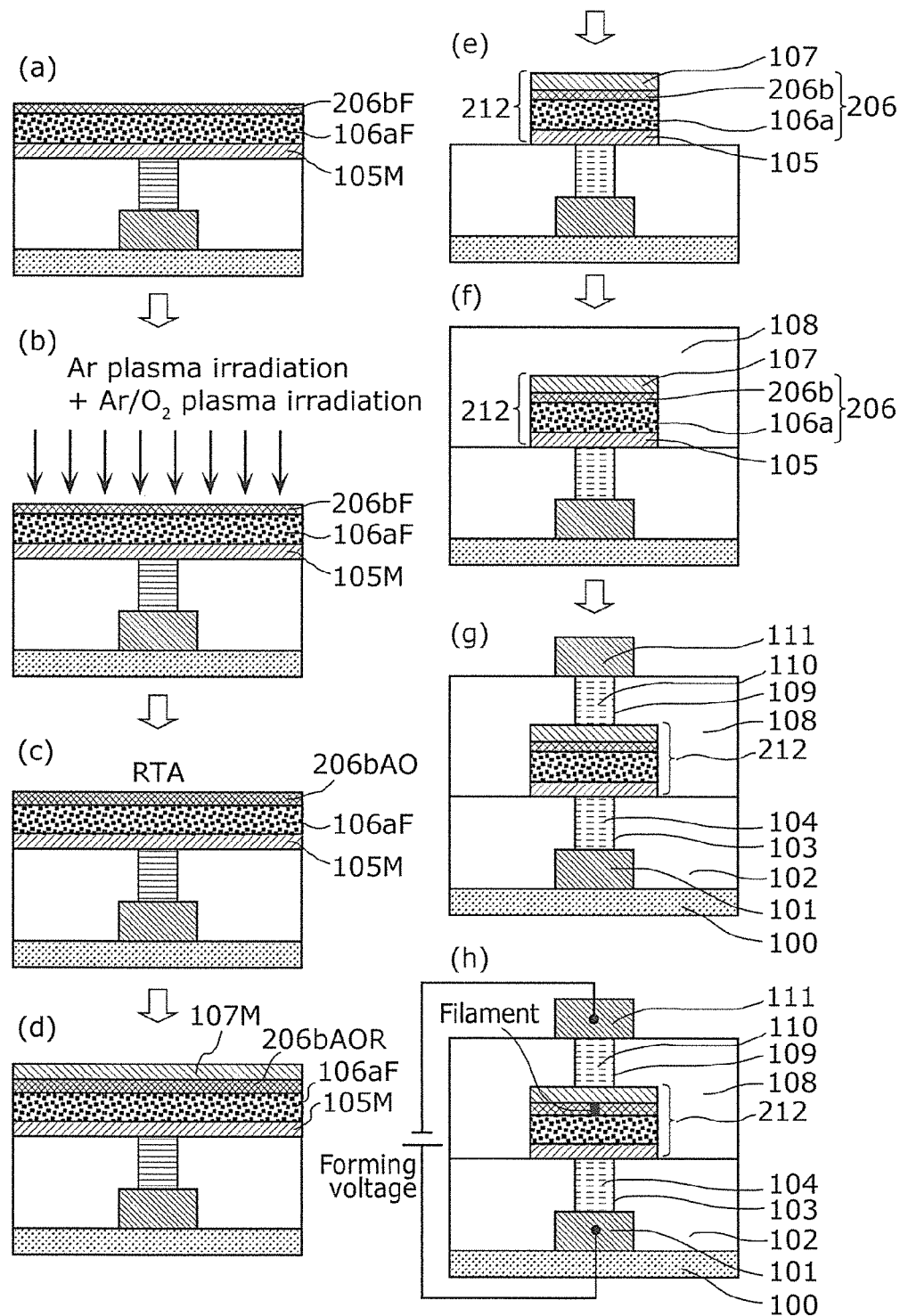
FIG. 12 consists of (a) to (h) which are cross-sectional views showing a main part of a method of manufacturing a nonvolatile memory device according to Embodiment 4 of the present invention.

FIG. 12 is cross-sectional views showing a main part of the method of manufacturing a nonvolatile memory device according to Embodiment 4 of the present invention. With reference to these views, the method of manufacturing a main part of the nonvolatile memory device according to Embodiment 4 is described. The method of manufacturing the nonvolatile memory device according to this embodiment is different from the method of manufacturing the nonvolatile memory device 10 according to Embodiment 2 shown in FIG. 7 only in performing the forming step on the variable resistance element. Descriptions on the same points as the manufacturing method according to Embodiment 2 are omitted, and the steps following forming the tantalum oxide material layer 206bF by sputtering are described below. It is to be noted that the following description shows mere examples in which particular materials, processing methods, and processing conditions are illustrative and not restrictive. The following manufacturing method is applicable in combination with a known method.

First, as shown in (a) of FIG. 12, the tantalum oxide material layer 206bF that eventually becomes the second variable resistance layer is formed under the same sputtering condition as in Embodiment 1.

Next, as shown in (b) of FIG. 12, Ar plasma treatment is performed on a surface of the tantalum oxide material layer 206bF using the plasma treatment device used in Embodiment 1. Subsequent to this Ar plasma irradiation step, an Ar/$O_2$ plasma irradiation step is performed. This Ar/$O_2$ plasma irradiation step allows the reconstruction of Ta—O bonds as described above, which improves the quality of the tantalum oxide material layer 206bF while not increasing the thickness of the tantalum oxide material layer 206bF.

Next, as shown in (c) of FIG. 12, an annealing step of heating the tantalum oxide material layer 206bA in a nitrogen gas atmosphere is performed.

Next, as shown in (d) of FIG. 12, the second electrode material layer 107M is formed.

The above-described steps (a) to (d) of FIG. 12 are the same or alike as the steps (a) to (d) of FIG. 7 in Embodiment 2.

Next, as shown in (e) of FIG. 12, a variable resistance element 212 is formed.

Next, as shown in (f) of FIG. 12, the second interlayer dielectric layer 108 is formed so as to cover the variable resistance element 212.

Next, as shown in (g) of FIG. 12, the second contact hole 109 and the second contact plug 110 are formed.

The above-described steps (e) to (g) of FIG. 12 are the same or alike as the steps shown in (e) to (g) of FIG. 3 in Embodiment 1.

In the end, as shown in (h) of FIG. 12, the forming process is performed on the variable resistance element 212. Specifically, a forming voltage is applied between the second electrode layer 107 and the first electrode layer 105. At the time of completion of the step shown in (g) of FIG. 12, the variable resistance element 212 has a resistance value at a higher level than the level of resistance value thereof in the normal operation. Here, with reference to the first electrode layer 105, a negative voltage pulse is applied to the second electrode layer 107 in the variable resistance element 212, for example. The application of this voltage pulse, i.e., the forming voltage (the initialization voltage pulse), causes the filament (the conductive path) to be formed from a surface of the second variable resistance layer 206b which is in contact with the second electrode layer 107 to the first variable resistance layer 106a, with the result that the variable resistance element 212 is placed in a state where the variable resistance element 212 can reversibly change between a normal high resistance state and a normal low resistance state.

At this time, since the quality of the tantalum oxide material layer 206bF has improved without an increase in its thickness because of the exposure to the mixture plasma of a noble gas, such as Ar, and oxygen in the plasma treatment shown in (b) of FIG. 12, the filament can be formed at lower forming voltage than in the case of not performing the above-stated plasma treatment, with the result that the forming process is facilitated. In addition, a filament current that flows through the formed filament is stabilized. Such an effect is prominent particularly in the case where the second variable resistance layer 206b is formed by sputtering.

Furthermore, also in the method of manufacturing the nonvolatile memory device according to this embodiment, the occurrence of diffusion of the oxygen in the tantalum oxide material layer 206bF into the tantalum oxide material layer 106aF or the second electrode material layer 107M can be reduced, with the result that the decrease in the effective thickness of the second variable resistance layer 206b can be reduced. Thus, the degradation of the oxygen concentration profile of the variable resistance layer 206 is inhibited, which can improve the device performance of the variable resistance element 212. Furthermore, the reduced variations in device performance can lead to a reduction in the variations of voltage which is applied to the variable resistance layer 206, with the result that high endurance characteristics can be provided.

The above effect is not obtained only using $Ar/O_2$ gas; mixture gas of other noble gases and oxygen may be used. In this embodiment, the noble gas-oxygen mixture gas is used to improve the quality of the high resistance layer, i.e., the second variable resistance layer, with oxygen ions and oxygen radicals from the film surface of the second variable resistance layer, and even in the case where ions of other noble gases than Ar gas, such as Kr, Xe, He, and Ne, are used, it is possible to produce such oxygen ions and oxygen radicals and therefore is possible to obtain the same or like effect.

Furthermore, as shown in the above-stated Embodiments 1 to 3, the endurance characteristics are enhanced due to the improvement in layer quality as long as the plasma treatment using gas containing at least a noble gas is performed. Thus, each of the above-stated Embodiments 1 to 3 may be combined as appropriate with the forming step in this embodiment.

The method of manufacturing a nonvolatile memory device according to the present invention has been described above based on Embodiments 1 to 3, but is not limited to the above-described Embodiments 1 to 3. The present invention includes variations obtained by making, to Embodiments 1 to 3, various modifications which those skilled in the art could think of without departing from the principles and spirit of the present invention, and various devices in which the nonvolatile memory device manufactured using the manufacturing method according to the present invention is embedded.

[Variation of Structure of Nonvolatile Memory Device]

Figure 13:
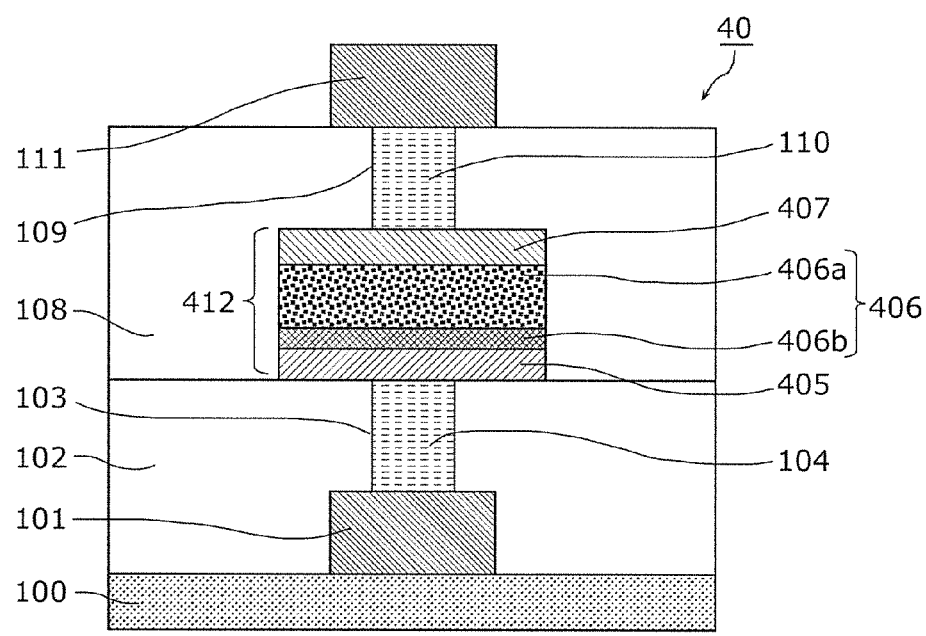
FIG. 13 is a cross-sectional view showing a schematic structure of a nonvolatile memory device according to Variation of Embodiment of the present invention.
Figure 14:
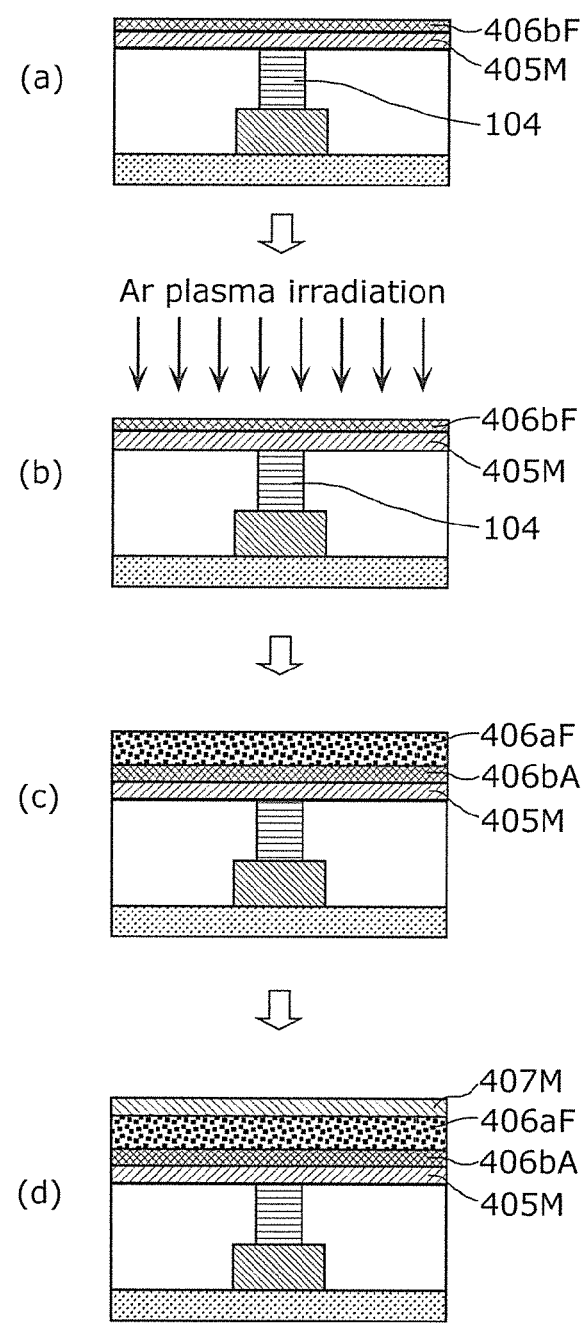
FIG. 14 consists of (a) to (d) which are cross-sectional views showing a main part of a method of manufacturing a nonvolatile memory device according to Variation of Embodiment of the present invention.
Figure 15:
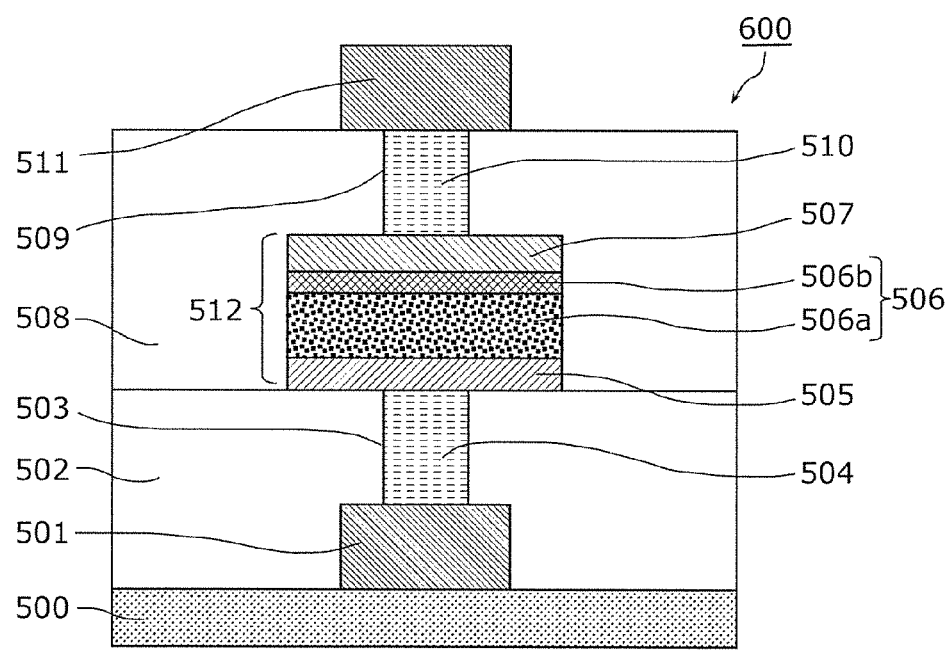
FIG. 15 schematically shows an example of a cross-sectional structure of a nonvolatile memory device in which a variable resistance element disclosed by PTL 2 is mounted.

In addition, the method of manufacturing a nonvolatile memory device according to the present invention is applied even when the variable resistance element included in the nonvolatile memory device described in each of Embodiments 1 to 3 has a structure in which a low resistance layer, i.e., the first variable resistance layer, and a high resistance layer, i.e., the second variable resistance layer, are stacked in the inverse order. With reference to FIGS. 13 and 14, the method of manufacturing a nonvolatile memory device having the above-stated structure is described below.

FIG. 13 is a cross-sectional view showing a schematic structure of a nonvolatile memory device according to Variation of Embodiment of the present invention. In FIG. 13, the same structural elements as those in the nonvolatile memory device 10 shown in FIG. 1 are denoted by the same reference signs, and descriptions on such structural elements are omitted. As shown in FIG. 13, a nonvolatile memory device 40 is different from the nonvolatile memory device 10 in positions of the first variable resistance layer having a low oxygen content atomic percentage and the second variable resistance layer having a high oxygen content atomic percentage. In the nonvolatile memory device 40 shown in FIG. 13, a variable resistance layer 406 has a structure in which a first variable resistance layer 406a that is a first oxide material layer having a lower oxygen content atomic percentage than a high oxygen content atomic percentage of a second variable resistance layer 406b that is a second oxide material layer is located on the second variable resistance layer 406b.

[Method of Manufacturing Nonvolatile Memory Device]

FIG. 14 is cross-sectional views showing a main part of the method of manufacturing a nonvolatile memory device according to Variation of Embodiment of the present invention. The method of manufacturing a nonvolatile memory device according to this variation is different from the method of manufacturing the nonvolatile memory device 10 according to Embodiment 1 shown in FIGS. 2 and 3 in the step of forming the second variable resistance layer and in the step of performing processing thereon. Descriptions on the same points as the manufacturing method according to Embodiment 1 are omitted, and the steps following forming the first contact plug 104 are described below.

As shown in (a) of FIG. 14, in a step of forming a first electrode material layer 405M and a tantalum oxide material layer 406bF having a high oxygen content atomic percentage, the first electrode material layer 405M (having a thickness of 20 to 50 nm) comprising iridium (Ir) is formed by sputtering on the first interlayer dielectric layer 102 so as to cover the first contact plug 104. Subsequently, on the first electrode material layer 405M, the tantalum oxide material layer 406bF is formed by sputtering. To form the tantalum oxide material layer 406bF, reactive sputtering is used in which tantalum is a target and oxygen is reactive gas. The condition for forming the tantalum oxide material layer 406bF by the reacting sputtering is, for example, 1000W for power output, 20 sccm for an Ar gas flow rate, 40 sccm for an oxygen flow rate, 0.06 Pa for a pressure, and a room temperature for a substrate temperature. The thickness of the tantalum oxide material layer 406bF which is effective in causing a resistance change is 3 to 10 nm when a tantalum oxide material layer 406aF having a low oxygen content atomic percentage is stacked as an upper layer on the tantalum oxide material layer 406bF. This layer-forming step corresponds to a first layer-forming step of forming the tantalum oxide material layer 406bF.

Next, as shown in (b) of FIG. 14, a step of irradiating with Ar plasma the tantalum oxide material layer 406bF that eventually becomes the second variable resistance layer 406b after the processing is performed, to improve the quality of the tantalum oxide material layer 406bA. In this step, a plasma device is used which includes the power supply for generating the plasma and a high frequency (RF) power supply for controlling substrate bias. The condition for this step is, for example, a room temperature for the substrate temperature at the time of the process, 500 W for power at the power supply for generating the plasma, 3 Pa for a pressure, Ar=100 sccm for a gas flow rate, and 5 minutes for processing time. This step leads to a reduction in the occurrence of diffusion from the second variable resistance layer 406b to the upper layer, i.e., the first variable resistance layer 406a. This Ar plasma irradiation step corresponds to plasma treatment of exposing a surface of the tantalum oxide material layer 406bF to plasma generated from gas containing at least a noble gas, and further corresponds to single-gas plasma treatment of exposing the surface of the tantalum oxide material layer 406bF to plasma generated from a single kind of noble gas.

Next, as shown in (c) of FIG. 14, in a step of forming the tantalum oxide material layer 406aF, the tantalum oxide material layer 406aF having a low oxygen content atomic percentage is formed on the tantalum oxide material layer 406bA. To form the tantalum oxide material layer 406aF, reactive sputtering is used in which a sputtering target comprising tantalum is used and sputtering is performed in an oxygen-containing-gas atmosphere. The thickness of the tantalum oxide material layer 406aF is, for example, 20 to 30 nm. The condition for sputtering is, for example, 1000 W for power output and 0.05 Pa for a layer formation pressure.

Next, as shown in (d) of FIG. 14, in a step of forming a second electrode material layer 407M, tantalum nitride (TaN) is formed by sputtering as the second electrode material layer 407M on the tantalum oxide material layer 406aF.

In the manufacturing method including the above steps, the nonvolatile memory device 40 including a variable resistance element 412 is manufactured.

In the nonvolatile memory device 40 according to the above variation, the tantalum oxide material layer 406aF having a low oxygen content atomic percentage is formed on the tantalum oxide material layer 406bF having a high oxygen content atomic percentage. This increases the selection range of the method of manufacturing the second variable resistance layer 406b.

In the nonvolatile memory device 10 in which the tantalum oxide material layer 106b is located on the tantalum oxide material layer 106aF, the tantalum oxide material layer 106aF having a low oxygen content atomic percentage is exposed to an oxygen plasma atmosphere in the case of forming the tantalum oxide material layer 106bF by reactive sputtering using oxygen for reactive gas, for example. This causes the surface of the tantalum oxide material layer 106aF to be oxidized, which leads to a failure to obtain the variable resistance layer 106 which has a target oxygen concentration profile.

In contrast, in the nonvolatile memory device 40, the tantalum oxide material layer 406aF is not exposed to oxygen plasma, with the result that, in the step of forming the tantalum oxide material layer 406bF shown in (a) of FIG. 14, the tantalum oxide material layer 406bF can be formed by the reactive sputtering in which tantalum is a target and oxygen is reactive gas. In this case, even when the plasma treatment or thermal treatment for improving the quality of the tantalum oxide material layer 406bF having a high oxygen content atomic percentage is performed after the tantalum oxide material layer 406bF is formed, there is no concern of oxygen diffusion into the tantalum oxide material layer 406aF having a low oxygen content atomic percentage because the tantalum oxide material layer 406aF has not been formed yet. In addition, the rate of forming the tantalum oxide material layer 406bF by the reactive sputtering is 6 nm/min, which is substantially five times as high as that (a layer-forming rate of 1.2 nm/min) in the manufacturing method shown in (b) of FIG. 3. Thus, in the method of manufacturing the nonvolatile memory device 40, the layer-forming rate can be high, which allows the nonvolatile memory device 40 to be manufactured at a lower cost than the nonvolatile memory device 10.

It is to be noted that, in the manufacturing method according to this variation, an example of performing, after forming the lower layer, i.e., the tantalum oxide material layer 406bF, only the Ar plasma treatment on the surface of the tantalum oxide material layer 406bF under the condition similar to the conditions described in Embodiment 1 has been described, but the Ar plasma treatment may be followed by the Ar+O$_2$ plasma treatment and the RTA process which are performed under the same or alike condition as the condition described in Embodiment 2. In this case, the occurrence of diffusion of the oxygen in the second variable resistance layer 406b formed through patterning of the tantalum oxide material layer 406bF in the subsequent step, into the first variable resistance layer 406a, is further reduced Furthermore, the forming step according to Embodiment 4 may be performed in the final step of the manufacturing method according to this variation. Even in this case, a decrease in the forming voltage, stabilization of the filament current, and enhancement of the endurance characteristics can be achieved at the same time as in Embodiment 4.

Furthermore, in each of the above Embodiments and Variation, the example where the variable resistance layer has a structure of stacked tantalum oxide layers has been described. It is to be noted that the tantalum oxide can be formed in a process at a temperature from a room temperature to a relatively low temperature. Thus, in the case where the step of processing the tantalum oxide is performed at a relatively low temperature, the occurrence of performance degradation of the variable resistance element or a nearby circuit element due to heat can be reduced. It is to be noted that the variable resistance layer according to this embodiment is not limited to the tantalum oxide. The variable resistance layer may be a variable resistance layer which has a structure of stacked hafnium (Hf) oxide layers or a structure of stacked zirconium (Zr) oxide layers, for example, and changes in resistance in a bipolar manner and in which a high resistance layer has a high resistance attributed to a variable resistance material of a type which contributes to a change in resistance through an oxidation-reduction reaction.

In the case of adopting the structure of stacked hafnium oxide layers, it is preferred that approximate ranges of $0.9 \leq x \leq 1.6$ and $1.8 < y < 2.0$ be satisfied where the composition of a first hafnium oxide is represented as $HfO_x$ and the composition of a second hafnium oxide is represented as $HfO_y$, and the thickness of a second hafnium oxide be at least 3 nm and at most 4 nm.

In the case of adopting the structure of stacked zirconium oxide layers, it is preferred that approximate ranges of $0.9 \leq x \leq 1.4$ and $1.9 < y < 2.0$ be satisfied where the composition of a first zirconium oxide is represented as $ZrO_x$ and the composition of a second zirconium oxide is represented as $ZrO_y$, and the thickness of a second zirconium oxide be at least 1 nm and at most 5 nm.

The main variable resistance layer in which a change in resistance occurs may contain, for example, a tiny amount of other elements than tantalum as long as it includes an oxide layer comprising tantalum or the like. In fine adjustment to the resistance value, for example, a small amount of other elements may be contained deliberately, which is a case included in the scope of the present invention. For example, adding nitrogen to the variable resistance layer causes the variable resistance layer to have a higher resistance value and thereby allows improvement in responsiveness to a change in resistance.

Furthermore, in the above Embodiments 1 to 4, the first transition metal in the first variable resistance layer and the second transition metal in the second variable resistance layer may be different transition metals. In this case, it is preferred that the second variable resistance layer have a degree of oxygen deficiency lower than a degree of oxygen deficiency of the first variable resistance layer. Here, the degree of oxygen deficiency indicates a rate of oxygen deficiency in each of the transition metals relative to the amount of oxygen included in the oxide having its stoichiometric composition.

By setting the degree of oxygen deficiency of the second variable resistance layer to be lower than the degree of oxygen deficiency of the first variable resistance layer, it is possible to set the resistance value of the second variable resistance layer to be higher than the resistance value of the first variable resistance layer. With such a structure, voltages applied between the first electrode layer and the second electrode layer at the time of a change in resistance are distributed more to the second variable resistance layer than to the first variable resistance layer according to the resistance values of these layers. Because of this, an oxidation-reduction reaction occurs more easily in the second variable resistance layer.

It is to be noted that, in the case where the first transition metal in the first variable resistance layer and the second transition metal in the second variable resistance layer are the same transition metal, "the second variable resistance layer having a higher oxygen content atomic percentage than an oxygen content atomic percentage of the first variable resistance layer" corresponds to "the second variable resistance layer having a degree of oxygen deficiency lower than a degree of oxygen deficiency of the first variable resistance layer". Accordingly, the relationship of the oxygen content atomic percentage in the above embodiments can be read as the relationship of the degree of oxygen deficiency where appropriate.

Furthermore, in the case where the above first transition metal and the above second transition metal are different materials, it is preferred that the standard electrode potential of the second transition metal be lower than the standard electrode potential of the first transition metal. The higher the standard electrode potential, the less tendency a metal has to be oxidized, and the lower the standard electrode potential, the more tendency a metal has to be oxidized. Oxidation-reduction reactions can be made to occur more easily in the second variable resistance layer by using, for the second variable resistance layer, a metal oxide having a lower standard electrode potential than that of the first variable resistance layer.

Here, it is conceivable that the resistance changing phenomenon occurs due to oxidation-reduction reactions occurring in the tiny filament (conductive path) formed inside the second variable resistance layer having a high resistance value, thereby causing the resistance value to change. Therefore, positioning in the second variable resistance layer a metal oxide having a standard electrode potential that is lower than that in the first variable resistance layer results in a resistance change occurring in the second variable resistance layer easily, which leads to a stable resistance changing operation.

For example, it may be that an oxygen-deficient tantalum oxide is used for the first variable resistance layer and titanium oxide ($TiO_2$) is used for the second variable resistance layer. Since titanium (standard electrode potential=$-1.63$ eV) has a lower standard electrode potential than tantalum (standard electrode potential=$-0.6$ eV), the resistance changing operation will be stable in this structure.

[Industrial Applicability]

The method of manufacturing a nonvolatile memory device according to the present invention has an advantageous effect of inhibiting the degradation of the oxygen-concentration profile of the variable resistance layer due to the heat budget and is useful as a method of manufacturing a nonvolatile memory device, such as a resistive random-access memory (ReRAM), which requires high reliability.

REFERENCE SIGNS LIST 10, 30, 40, 600 Nonvolatile memory device
100, 500 Substrate
101, 501 First line
102, 502 First interlayer dielectric layer
103, 503 First contact hole
104, 504 First contact plug
104M Conductive layer
105, 505 First electrode layer
105M, 405M First electrode material layer
106, 206, 406, 506 Variable resistance layer
106a, 406a First variable resistance layer
106aF, 106bF, 106bA, 206bA, 206bAO, 206bAOR, 206bF, 406aF,
406bA, 406bF Tantalum oxide material layer
106b, 206b, 306b3, 406b Second variable resistance layer
107, 507 Second electrode layer
107M, 407M Second electrode material layer
108, 508 Second interlayer dielectric layer
109, 509 Second contact hole
110, 510 Second contact plug
111, 511 Second line
112, 212, 312, 412, 512 Variable resistance element
306b1, 306b1AO, 306b1AOR, 306b1F Lower layer
306b2, 306b2AO, 306b2AOR, 306b2F Upper layer
506a First tantalum oxide layer
506b Second tantalum oxide layer

The invention claimed is:

1. A method of manufacturing a nonvolatile memory device, the method comprising:
   forming a first oxide material layer comprising an oxygen-deficient transition metal oxide;
   forming a second oxide material layer comprising a transition metal oxide and having a degree of oxygen deficiency lower than a degree of oxygen deficiency of the first oxide material layer; and
   exposing the second oxide material layer to plasma after the forming of a second oxide material layer, the plasma being generated from a noble gas.

2. The method of manufacturing a nonvolatile memory device according to claim 1,
   wherein in the exposing, the second oxide material layer is exposed to plasma generated from a noble gas only.

3. The method of manufacturing a nonvolatile memory device according to claim 2,
   wherein in the exposing, the noble gas is a single kind of noble gas.

4. The method of manufacturing a nonvolatile memory device according to claim 1, further comprising:
   forming a first electrode material layer above a substrate; and
   forming a second electrode material layer on the second oxide material layer,
   wherein in the forming of a first oxide material layer, the first oxide material layer is formed on the first electrode material layer, and
   in the forming of a second oxide material layer, the second oxide material layer is formed on the first oxide material layer.

5. The method of manufacturing a nonvolatile memory device according to claim 1, further comprising:
   forming a first electrode material layer above a substrate; and
   forming a second electrode material layer on the first oxide material layer,
   wherein in the forming of a second oxide material layer, the second oxide material layer is formed on the first electrode material layer, and
   in the forming of a first oxide material layer, the first oxide material layer is formed on the second oxide material layer.

6. The method of manufacturing a nonvolatile memory device according to claim 1,
   wherein the forming of a second oxide material layer and the exposing are continuously repeated more then once.

7. The method of manufacturing a nonvolatile memory device according to claim 1,
   wherein the first oxide material layer comprises tantalum oxide having a composition represented as $TaO_x$ (where $0.8 \leq x \leq 1.9$), and
   the second oxide material layer comprises tantalum oxide having a composition represented as $TaO_y$ (where $x<y$).

8. The method of manufacturing a nonvolatile memory device according to claim 1,
   wherein the second oxide material layer is formed as a deposited film.

9. The method of manufacturing a nonvolatile memory device according to claim 1,
   wherein the second oxide material layer is deposited by sputtering.

10. A method of manufacturing a nonvolatile memory device, the method comprising:
    forming a first electrode material layer above a substrate;
    depositing, on the first electrode material layer, a first oxide material layer comprising an oxygen-deficient transition metal oxide;
    depositing, on the first oxide material layer, a second oxide material layer comprising a transition metal oxide and having a degree of oxygen deficiency lower than a degree of oxygen deficiency of the first oxide material layer;
    exposing the second oxide material layer to plasma after the depositing of a second oxide material layer, the plasma being generated from gas containing at least a noble gas;
    forming a second electrode material layer on the second oxide material layer after the exposing; and
    applying an initialization voltage pulse between a first electrode layer and a second electrode layer to form a conductive path in a variable resistance element including the first electrode layer, a first variable resistance layer, a second variable resistance layer, and the second electrode layer which are formed through patterning of the first electrode material layer, the first oxide material layer, the second oxide material layer, and the second electrode material layer, respectively, the conductive path extending from one surface to another of the second variable resistance layer, the one surface being in contact with the second electrode layer, and the other surface being in contact with the first variable resistance layer.

11. The method of manufacturing a nonvolatile memory device according to claim 10,
    wherein the exposing includes mixture plasma treatment of exposing the second oxide material layer to plasma generated from a gas mixture of a noble gas and oxygen.

12. The method of manufacturing a nonvolatile memory device according to claim 11,
    wherein the exposing further includes, before the mixture plasma treatment, single-gas plasma treatment of exposing the second oxide material layer to plasma generated from single kind of noble gas.

13. The method of manufacturing a nonvolatile memory device according to claim 11,
    wherein the exposing further includes, after the mixture plasma treatment, annealing which is thermal treatment in a nitrogen gas atmosphere.

14. The method of manufacturing a nonvolatile memory device according to claim 10,
    wherein the forming of a second oxide material layer and the exposing are continuously repeated more then once.

15. The method of manufacturing a nonvolatile memory device according to claim 10,
    wherein the first oxide material layer comprises tantalum oxide having a composition represented as $TaO_x$ (where $0.8 \leq x \leq 1.9$), and
    the second oxide material layer comprises tantalum oxide having a composition represented as $TaO_y$ (where $x<y$).

16. The method of manufacturing a nonvolatile memory device according to claim 10,
    wherein the second oxide material layer is deposited by sputtering.

17. A method of manufacturing a nonvolatile memory device, the method comprising:
    forming a first electrode material layer above a substrate;
    depositing, on the first electrode material layer, a second oxide material layer comprising a transition metal oxide;
    depositing, on the second oxide material layer, a first oxide material layer comprising an oxygen-deficient transition metal oxide and having a degree of oxygen deficiency higher than a degree of oxygen deficiency of the second oxide material layer;

exposing the second oxide material layer to plasma before the depositing of a first oxide material layer after the depositing of a second oxide material layer, the plasma being generated from gas containing at least a noble gas;

forming a second electrode material layer on the first oxide material layer after the depositing of a first oxide material layer; and applying an initialization voltage pulse between a first electrode layer and a second electrode layer to form a conductive path in a variable resistance element including the first electrode layer, a second variable resistance layer, a first variable resistance layer, and the second electrode layer which are formed through patterning of the first electrode material layer, the second oxide material layer, the first oxide material layer, and the second electrode material layer, respectively, the conductive path extending from one surface to another of the second variable resistance layer, the one surface being in contact with the first electrode layer, and the other surface being in contact with the first variable resistance layer.

18. The method of manufacturing a nonvolatile memory device according to claim 17,
wherein the exposing includes mixture plasma treatment of exposing the second oxide material layer to plasma generated from a gas mixture of a noble gas and oxygen.

19. The method of manufacturing a nonvolatile memory device according to claim 18,
wherein the exposing further includes, before the mixture plasma treatment, single-gas plasma treatment of exposing the second oxide material layer to plasma generated from single kind of noble gas.

20. The method of manufacturing a nonvolatile memory device according to claim 18,
wherein the exposing further includes, after the mixture plasma treatment, annealing which is thermal treatment in a nitrogen gas atmosphere.

21. The method of manufacturing a nonvolatile memory device according to claim 17,
wherein the forming of a second oxide material layer and the exposing are continuously repeated more then once.

22. The method of manufacturing a nonvolatile memory device according to claim 17,
wherein the first oxide material layer comprises tantalum oxide having a composition represented as $TaO_x$ (where $0.8 \leq x \leq 1.9$), and
the second oxide material layer comprises tantalum oxide having a composition represented as $TaO_y$ (where $x<y$).

23. The method of manufacturing a nonvolatile memory device according to claim 17,
wherein the second oxide material layer is deposited by sputtering.

* * * * *